(12) United States Patent
Cho et al.

(10) Patent No.: US 11,387,312 B2
(45) Date of Patent: Jul. 12, 2022

(54) DISPLAY DEVICE

(71) Applicant: SAMSUNG DISPLAY CO., LTD., Yongin-si (KR)

(72) Inventors: Yoonjong Cho, Yongin-si (KR); Donghwi Kim, Yongin-si (KR); Jin Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 134 days.

(21) Appl. No.: 17/003,522

(22) Filed: Aug. 26, 2020

(65) Prior Publication Data

US 2021/0249498 A1 Aug. 12, 2021

(30) Foreign Application Priority Data

Feb. 7, 2020 (KR) .......................... 10-2020-0015203

(51) Int. Cl.
*H01L 27/32* (2006.01)
*H01L 29/786* (2006.01)

(52) U.S. Cl.
CPC ...... *H01L 27/3276* (2013.01); *H01L 29/7869* (2013.01); *H01L 29/78651* (2013.01)

(58) Field of Classification Search
CPC ............. H01L 27/1214; H01L 27/1222; H01L 27/124; H01L 27/1244; H01L 27/1255; H01L 27/32; H01L 27/3244; H01L 27/3246; H01L 27/3262; H01L 27/3265; H01L 27/3272; H01L 27/3276; H01L 27/3279; H01L 29/772; H01L 29/786; H01L 29/78651; H01L 29/7866; H01L 29/7869; H01L 29/78696; H01L 51/50; H01L 51/52; H01L 51/524; H01L 51/5253
See application file for complete search history.

(56) References Cited

U.S. PATENT DOCUMENTS

| | | | |
|---|---|---|---|
| 10,283,054 B2 | 5/2019 | Park et al. | |
| 10,629,128 B2 | 4/2020 | Yang et al. | |
| 2015/0228664 A1 | 8/2015 | Lee et al. | |
| 2018/0366586 A1 | 12/2018 | Son et al. | |
| 2019/0245023 A1 | 8/2019 | Kim et al. | |
| 2019/0252479 A1 | 8/2019 | Kang et al. | |

FOREIGN PATENT DOCUMENTS

| | | |
|---|---|---|
| EP | 3557623 | 10/2019 |
| KR | 10-2017-0124679 | 11/2017 |
| KR | 10-2018-0137640 | 12/2018 |
| KR | 10-2019-0027057 | 3/2019 |

*Primary Examiner* — Cheung Lee
(74) *Attorney, Agent, or Firm* — F. Chau & Associates, LLC

(57) ABSTRACT

A display device includes a first thin-film transistor (TFT) including a first semiconductor layer including silicon semiconductor and a first gate electrode insulated from the first semiconductor layer, a first interlayer insulating layer covering the first gate electrode, a second TFT arranged on the first interlayer insulating layer and including a second semiconductor layer including oxide semiconductor and a second gate electrode insulated from the second semiconductor layer, a second interlayer insulating layer covering the second gate electrode, a first power supply voltage line arranged on the second interlayer insulating layer, a first planarization layer covering the first power supply voltage line, and a data line arranged on the first planarization layer and at least partially overlapping the first power supply voltage line.

20 Claims, 20 Drawing Sheets

DISPLAY DEVICE

CROSS-REFERENCE TO RELATED APPLICATION

This application claims the benefit under 35 U.S.C. § 119 of Korean Patent Application No. 10-2020-0015203, filed on Feb. 7, 2020, in the Korean Intellectual Property Office, the disclosure of which is incorporated by reference herein in its entirety.

TECHNICAL FIELD

The present disclosure relates to a display device, and more particularly, to a display device that is driven by a thin-film transistor (TFT) including silicon semiconductor and a TFT including oxide semiconductor.

DISCUSSION OF RELATED ART

Generally, a display device includes a display element capable of emitting light and a driving circuit for controlling an electrical signal applied to the display element. The driving circuit includes a thin-film transistor (TFT), a storage capacitor, and a plurality of wiring lines.

To accurately control light emission of the display element and luminescence level of the light emitted from the display element, the number of TFTs electrically connected to one display element has increased. Accordingly, research has been actively conducted to achieve higher degree of integration of display devices and to reduce power consumption of display devices.

SUMMARY

Exemplary embodiments of the present disclosure include a display device that is driven by a thin-film transistor (TFT) including silicon semiconductor and a TFT including oxide semiconductor, thereby increasing the degree of integration of the display device while reducing the power consumption of the display device.

Additional aspects will be set forth in part in the description which follows and, in part, will be apparent from the description, or may be learned by practice of the presented exemplary embodiments of the present disclosure.

According to an exemplary embodiment of the present disclosure, a display device includes a substrate including a display area in which a display element is arranged, a first thin-film transistor (TFT) arranged in the display area and including a first semiconductor layer including silicon semiconductor and a first gate electrode insulated from the first semiconductor layer, a first interlayer insulating layer covering the first gate electrode, a second TFT arranged on the first interlayer insulating layer and including a second semiconductor layer including oxide semiconductor and a second gate electrode insulated from the second semiconductor layer, a second interlayer insulating layer covering the second gate electrode, a first power supply voltage line arranged on the second interlayer insulating layer, a first planarization layer covering the first power supply voltage line, and a data line arranged on the first planarization layer and at least partially overlapping the first power supply voltage line.

The display device may further include a node connection line arranged on the second interlayer insulating layer, and the node connection line may have one end electrically connected to the first gate electrode, and an other end electrically connected to the second semiconductor layer.

The display device may further include a second power supply voltage line arranged on the first planarization layer and electrically connected to the first power supply voltage line.

The second power supply voltage line may overlap the second semiconductor layer.

A portion of the second power supply voltage line may be arranged between the data line and the node connection line when seen in a plan view.

The second TFT may further include a third gate electrode arranged below the second semiconductor layer, and the third gate electrode may overlap the second semiconductor layer.

The display device may further include a first capacitor including a lower electrode arranged on a layer the same as that of the first gate electrode and an upper electrode arranged above the lower electrode, in which the upper electrode may be arranged on a layer the same as that of the third gate electrode.

The upper electrode of the first capacitor may be electrically connected to the first power supply voltage line.

The display device may further include a second capacitor including a lower electrode arranged on a layer the same as that of the first gate electrode and an upper electrode arranged on a layer the same as that of the second semiconductor layer.

The upper electrode of the second capacitor may include oxide semiconductor.

The upper electrode of the second capacitor may extend from the second semiconductor layer.

The display device may further include a second planarization layer covering the data line, and the display element may be an organic light-emitting diode (OLED) arranged on the second planarization layer.

According to an exemplary embodiment of the present disclosure, a display device includes a substrate including a display area in which a display element is arranged, a first thin-film transistor (TFT) arranged in the display area and including a first semiconductor layer including silicon semiconductor and a first gate electrode insulated from the first semiconductor layer, a first interlayer insulating layer covering the first gate electrode, a second TFT arranged on the first interlayer insulating layer and including a second semiconductor layer including oxide semiconductor and a second gate electrode insulated from the second semiconductor layer, a first power supply voltage line arranged in the display area and extending in a first direction, a second power supply voltage line extending in the first direction and electrically connected to the first power supply voltage line, and a data line spaced apart from the second power supply voltage line, extending in the first direction, and at least partially overlapping the first power supply voltage line.

The first power supply voltage line may be arranged between the data line and the first gate electrode.

The second power supply voltage line may overlap the second semiconductor layer.

The display device may further include a node connection line having one end electrically connected to the first gate electrode, and an other end electrically connected to the second semiconductor layer.

A portion of the second power supply voltage line may be arranged between the data line and the node connection line when seen in a plan view.

The second TFT may further include a third gate electrode arranged below the second semiconductor layer, and the third gate electrode may overlap the second semiconductor layer.

The display device may further include a capacitor including a lower electrode arranged on a layer the same as that of the first gate electrode and an upper electrode arranged on a layer the same as that of the second semiconductor layer.

The upper electrode of the capacitor may extend from the second semiconductor layer.

According to an exemplary embodiment of the present disclosure, a display device includes a substrate including a first area that includes a display area and a peripheral area surrounding the display area, a second area that also includes the peripheral area, and a bending area located between the first area and the second area, the substrate being bent, a driver arranged in the second area to supply scan signals and data signals to respective scan lines and data lines located in the display area, a display member arranged in the display area to display an image and including a plurality of pixels each including a display element and a pixel circuit, the pixel circuit including at least a first thin-film transistor (TFT) and at least a second TFT different from the first TFT and receiving scan signals and data signals supplied from the driver to control light emission of the display element, a sensing member arranged on the display member to sense an external input, and a polarizing member arranged on the sensing member and comprising an anti-reflective layer to reduce reflectance of light incident from outside toward the display member, or a lens layer to enhance light output efficiency of light emitted from the display member or to reduce color deviation. The first TFT may include a first semiconductor layer including silicon semiconductor and a first gate electrode insulated from the first semiconductor layer, a first interlayer insulating layer may cover the first gate electrode, and the second TFT may be arranged on the first interlayer insulating layer and may include a second semiconductor layer including oxide semiconductor and a second gate electrode insulated from the second semiconductor layer.

The display device may further include a second interlayer insulating layer covering the second gate electrode, a first power supply voltage line arranged on the second interlayer insulating layer, a first planarization layer covering the first power supply voltage line, and a data line arranged on the first planarization layer and at least partially overlapping the first power supply voltage line.

BRIEF DESCRIPTION OF THE DRAWINGS

The above and other aspects and features of the present disclosure will be more apparent from the following description of the exemplary embodiments taken in conjunction with the accompanying drawings, in which.

Figure 1:
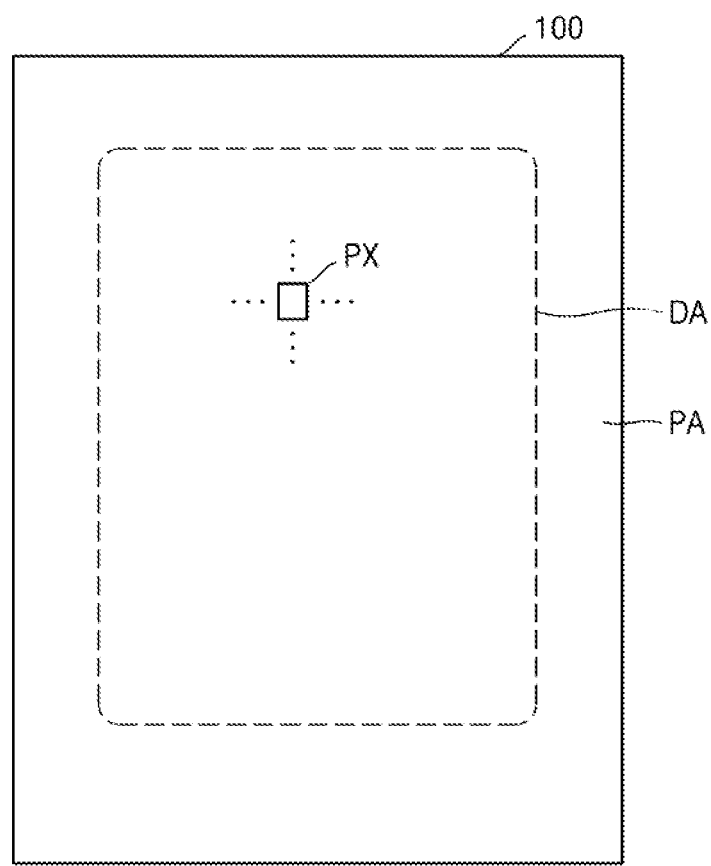
FIG. 1 is a schematic diagram of a display device according to an exemplary embodiment of the present disclosure.
Figure 1:
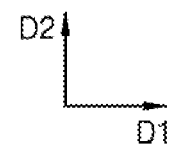

Since the drawings in FIGS. 1-12 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Reference will now be made in detail to exemplary embodiments of the present disclosure, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first", "second", etc. may be used herein to describe various elements, these elements should not be limited by these terms. These terms are only used to distinguish one element from another.

As used herein, the singular forms "a", "an" and "the" are intended to include the plural forms as well, unless the context clearly indicates otherwise.

It will be understood that terms such as "comprise", "include" and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements interposed therebetween.

In this specification, the expression "A and/or B" indicates only A, only B, or both A and B. Throughout the disclosure, the expression "at least one of A and B" indicates only A, only B, or both A and B.

In the following exemplary embodiments, the expression "a line extends in a "first direction" or a "second direction"" as used herein may include not only a case in which a line extends in a linear shape but also a case in which a line extends in zigzag or a curved shape along the first direction or the second direction.

In the following exemplary embodiments, the expression "when seen in a plan view" as used herein may indicate a case in which an object is seen from above, and the expression "when seen in a cross-sectional view" as used herein may indicate a case in which a cross-section obtained by cutting an object vertically is seen from the side. In the following exemplary embodiments, the expression "a first element overlaps a second element" may mean that a first element is arranged above or below a second element. In other words, the first element overlaps the second element in a direction perpendicular to the top surface of the substrate.

FIG. 1 is a schematic diagram of a display device according to an exemplary embodiment of the present disclosure.

The display device according to an exemplary embodiment of the present disclosure may be implemented as an electronic device, such as, for example, a smartphone, a mobile phone, a smart watch, a navigation device, a game console, a television (TV), a vehicle head unit, a vehicle instrument panel, a notebook computer, a laptop computer, a tablet computer, a personal media player (PMP), and a personal digital assistant (PDA). Also, the electronic device may be a flexible device.

A substrate 100 may be divided into a display area DA in which an image is displayed and a peripheral area PA arranged around the display area DA.

The substrate 100 may include various materials, for example, glass, metal, or plastics. According to an exemplary embodiment of the present disclosure, the substrate 100 may include a flexible material. The flexible material refers to a substrate that is well bendable, foldable, or rollable. The flexible substrate 100 may include, for example, ultra-thin glass, metal, or plastics. For example, the substrate 100 may include, for example, a glass material and/or a polymer resin, and may have a multi-layer structure.

Pixels PX, each including a display element such as an organic light-emitting diode (OLED), may be arranged in the display area DA of the substrate 100. A plurality of pixels PX may be provided. The pixels PX may be arranged in various forms, for example, a stripe form, a pentile form, or a mosaic form, and may implement an image.

When seen in a plan view, the display area DA may have a rectangular shape as illustrated in FIG. 1. In an exemplary embodiment of the present disclosure, the display area DA may have, for example, a polygonal shape (e.g., a triangular shape, a pentagonal shape, a hexagonal shape, etc.), a circular shape, an elliptical shape, or an irregular shape. In an exemplary embodiment of the present disclosure, the display area DA may approximately have a quadrangular shape, and four corner portions of the display area DA may each have a round shape having a predetermined curvature.

The peripheral area PA of the substrate 100 is an area arranged around the display area DA and may be an area in which an image is not displayed. The peripheral area PA may surround the display area DA, and may also have a rectangular shape on the outside. However, the present disclosure is not limited thereto, and a shape of the display area DA and a shape of the peripheral area PA may have various shapes and may be designed relatively. Various lines configured to transmit an electrical signal to be applied to the display area DA, pads to which a printed circuit board or a driver integrated circuit (IC) chip is attached, and the like may be located in the peripheral area PA.

Hereinafter, for convenience, a display device including an OLED as a display element will be described. However, the present disclosure is not limited thereto. For example, the display device may include various types of display devices, for example, a liquid crystal display, an electrophoretic display, a field emission display, a surface-conduction electron-emitter display, a plasma display, a cathode ray display, and an inorganic electroluminescence (EL) display.

Figure 2:
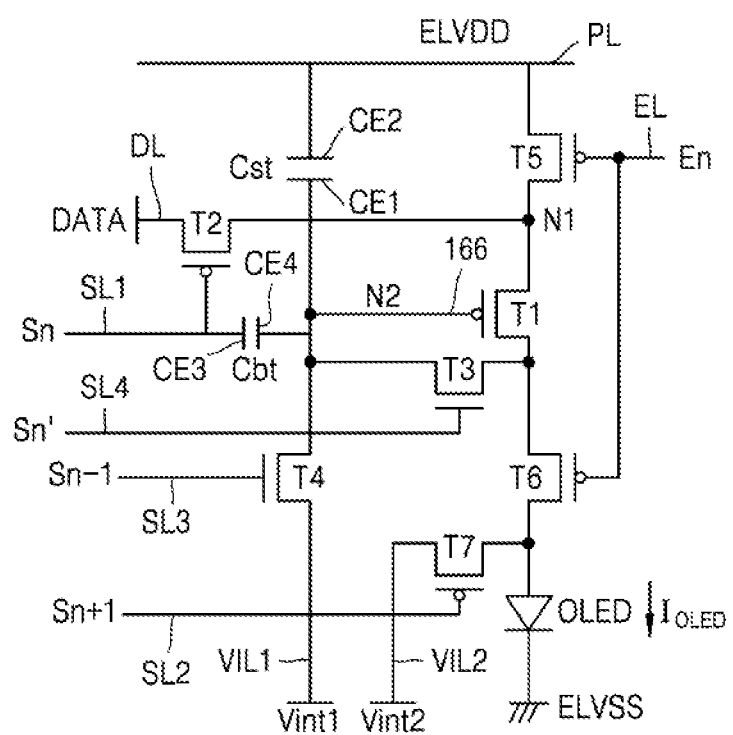
FIG. 2 is an equivalent circuit diagram of a pixel according to an exemplary embodiment of the present disclosure.

FIG. 2 is an equivalent circuit diagram of a pixel according to an exemplary embodiment of the present disclosure.

Referring to FIG. 2, the pixel PX may include an OLED as a display element and a pixel circuit connected to the OLED. The pixel circuit may include a plurality of transistors such as first to seventh transistors T1, T2, T3, T4, T5, T6, and T7, a first capacitor Cst, and a second Capacitor Cbt. The pixel circuit may be connected to signal lines, first and second initialization voltage lines VIL1 and VIL2, and a power supply voltage lines PL. The signal lines may include a data line DL, a first scan line SL1, a second scan line SL2, a third scan line SL3, a fourth scan line SL4, and an emission control line EL. In an exemplary embodiment of the present disclosure, at least one of the signal lines, the first and second initialization voltage lines VIL1 and VIL2, and/or the power supply voltage line PL may be shared with the adjacent pixels.

The power supply voltage line PL may be configured to transmit a first power supply voltage ELVDD to the first transistor T1. The first initialization voltage line VIL1 may be configured to transmit, to the pixel PX, a first initialization voltage Vint1 for initializing the first transistor T1. The second initialization voltage line VIL2 may be configured to transmit, to the pixel PX, a second initialization voltage Vint2 for initializing the OLED.

The first scan line SL1, the second scan line SL2, the third scan line SL3, the fourth scan line SL4, the emission control line EL, and the first and second initialization voltage lines VIL1 and VIL2 may extend in a first direction D1 and may be spaced apart from each other in each row. The data line DL and the power supply voltage line PL may extend in a second direction D2 and may be spaced apart from each other in each column.

FIG. 2 illustrates that the third transistor T3 and the fourth transistor T4 among the first to seventh transistors T1 to T7 are each implemented as an n-channel metal-oxide-semiconductor field effect transistor (MOSFET) (NMOS) and the others thereof are each implemented as a p-channel MOSFET (PMOS).

The first transistor T1 may be connected to the power supply voltage line PL through the fifth transistor T5 and electrically connected to the anode of the OLED through the sixth transistor T6. The first transistor T1 serves as a driving transistor and may be configured to receive a data signal DATA according to a switching operation of the second transistor T2, which serves as a switching transistor, and supply a driving current $I_{OLED}$ to the OLED.

A gate electrode of the first transistor T1 may be connected to the first electrode CE1 of the first capacitor Cst, a source electrode of the first transistor T1 may be connected to the power supply voltage line PL via the fifth transistor T5, and a drain electrode of the first transistor T1 may be electrically connected to an anode of the OLED via the sixth transistor T6.

The second transistor T2 may be connected to the first scan line SL1 and the data line DL, and connected to the power supply voltage line PL through the fifth transistor T5. The second transistor T2 may be turned on according to a first scan signal Sn received through the first scan line SL1 to perform a switching operation of transmitting, to a node N1, the data signal DATA transmitted to the data line DL. For example, a gate electrode of the second transistor T2 may be connected to the first scan line SL1, a source electrode of the second transistor T2 may be connected to the data line DL, and a drain electrode of the second transistor T2 may be connected to the node N1 and the source electrode of the first transistor T1.

The third transistor T3, which serves as a compensation transistor, may be connected to the fourth scan line SL4 and connected to the OLED through the sixth transistor T6. The third transistor T3 may be turned on according to a fourth scan signal Sn' received through the fourth scan line SL4 to connect the gate electrode and the drain electrode of the first transistor T1 so as to to diode-connect the first transistor T1.

The fourth transistor T4, which serves as an initialization transistor, may be connected to the third scan line SL3, which is a previous scan line, and the first initialization voltage line VIL1, and may be turned on according to a third scan signal Sn−1, which is a previous scan signal received through the third scan line SL3, to transmit the first initialization voltage Vint1 from the first initialization voltage line VIL1 to the gate electrode of the first transistor T1 so as to initialize a voltage of the gate electrode of the first transistor T1. For example, a drain electrode of the fourth transistor T4 may be connected to both the gate electrode of the first transistor T1 and the drain electrode of the third transistor T3. The third transistor T3 and the fourth transistor T4 may each be configured to have a dual gate structure to cut off a leakage current.

The fifth transistor T5, which serves as an operation control transistor, and the sixth transistor T6, which serves as a light emission control transistor, may be connected to the emission control line EL and may be simultaneously turned on according to an emission control signal En received through the emission control line EL to form a current path so that the driving current $I_{OLED}$ flows from the power supply voltage line PL toward the OLED.

The seventh transistor T7 may be connected to the second scan line SL2, which is a next scan line, and the second initialization voltage line VIL2, and may be turned on according to a second scan signal Sn+1, which is a next scan signal, received through the second scan line SL2, to transmit the second initialization voltage Vint2 from the second initialization voltage line VIL2 to the OLED so as to initialize the OLED. The seventh transistor may be configured differently. For example, in an exemplary embodiment of the present disclosure, a drain electrode of the seventh transistor T7 may be connected to both the first initialization voltage line VIL1 (not the second initialization voltage line VIL2) and the source electrode of the fourth transistor T4. In an exemplary embodiment of the present disclosure, the gate electrode of the seventh transistor T7 may be connected to the third scan line SL3 not the second scan line SL2, and the drain electrode of the seventh transistor T7 may be connected to both the first initialization voltage line VIL1 (not the second initialization voltage line VIL2) and the source electrode of the fourth transistor T4. In an exemplary embodiment of the present disclosure, the seventh transistor T7 may be omitted.

The first capacitor Cst may include a first electrode CE1 and a second electrode CE2. The first electrode CE1 may be connected to the gate electrode of the first transistor T1, and the second electrode CE2 may be connected to the power supply voltage line PL. The first capacitor Cst may be configured to store and maintain a voltage corresponding to a difference between voltages of the power supply voltage line PL and the gate electrode of the first transistor T1, so that the voltage applied to the gate electrode of the first transistor T1 is maintained.

The second capacitor Cbt may include a third electrode CE3 and a fourth electrode CE4. The third electrode CE3 may be connected to the first scan line SL1 and a gate electrode of the second transistor T2. The fourth electrode CE4 may be connected to the gate electrode of the first transistor T1 and the first electrode CE1 of the first capacitor Cst. The second capacitor Cbt is a boosting capacitor. When the first scan signal Sn of the first scan line SL1 is a voltage for turning off the second transistor T2, the second capacitor Cbt may increase the voltage of the node N2 so that a voltage (black voltage) displaying black is reduced. The seven-transistor and two-capacitor structure is illustrated in the exemplary embodiment of the present disclosure above, but the present disclosure is not limited thereto, and the number of transistors and the number of capacitors may be variously changed.

The OLED may include a pixel electrode and an opposite electrode, and the opposite electrode may be configured to receive a second power supply voltage ELVSS. The pixel electrode may be the anode of the OLED, and the opposite electrode may be the cathode of the OLED. The OLED may be configured to receive the driving current $I_{OLED}$ from the first transistor T1 and emit light to display an image.

A specific operation of each pixel PX according to an exemplary embodiment of the present disclosure is as follows.

During a first initialization period, when the previous first scan signal Sn−1 is supplied through the third scan line SL3, the fourth transistor T4 may be turned on in response to the previous first scan signal Sn−1 and the first transistor T1 may be initialized by the first initialization voltage Vint1 supplied from the first initialization voltage line VIL1 to the first transistor T1 through the fourth transistor T4.

During a data programming period, when the first scan signal Sn and the fourth scan signal Sn' are supplied through the first scan line SL1 and the fourth scan line SL4, respectively, the second transistor T2 and the third transistor T3 may be turned on in response to the first scan signal Sn and the fourth scan signal Sn'. In this case, the first transistor T1 may be diode-connected by the turned-on third transistor T3 and biased in a forward direction, since the first transistor T1 has been initialized during the first initialization period. A voltage compensated for a threshold voltage (Vth) of the first transistor T1 in the data signal DATA supplied from the data line DL passing through the second transistor T2, the first transistor TI, and the third transistor T3 may be applied to the gate electrode of the first transistor T1. The first power supply voltage ELVDD and the compensation voltage may be applied to both terminals of the first capacitor Cst, and charges corresponding to the voltage difference between both terminals of the first capacitor Cst may be stored in the first capacitor Cst.

During an emission period, the fifth transistor T5 and the sixth transistor T6 may be turned on by the emission control signal En supplied from the emission control line EL. By doing so, the first power supply voltage ELVDD supplied from the power supply voltage line PL may pass through the fifth transistor T5, the first transistor TI, and the sixth transistor T6, toward the OLED. The driving current $I_{OLED}$ occurs according to the voltage difference between the voltage of the gate electrode of the first transistor T1 and the first power supply voltage ELVDD, and the driving current $I_{OLED}$ may be supplied to the OLED through the sixth transistor T6.

During a second initialization period, when a second scan signal Sn+1 is supplied through the second scan line SL2, the seventh transistor T7 may be turned on in response to the second scan signal Sn+1, and the OLED may be initialized by the second initialization voltage Vint2 supplied from the second initialization voltage line VIL2 to the OLED through the seventh transistor T7.

In the present exemplary embodiment, at least one of the transistors T1 to T7 may include a semiconductor layer containing oxide semiconductor, and the others thereof may include a semiconductor layer containing silicon (Si). Specifically, the first transistor T1 that directly influences the brightness of the display device may be configured to include a semiconductor layer including polycrystalline silicon (p-Si) with high reliability, thereby implementing a high-resolution display device.

Because the oxide semiconductor has high carrier mobility and low leakage current, a voltage drop is not great even when the driving time is long. That is, because a color change of an image due to the voltage drop is not great even during low frequency driving, low frequency driving is possible. As such, the oxide semiconductor has a small leakage current. Therefore, when at least one of the third transistor T3 and the fourth transistor T4 connected to the gate electrode of the first transistor T1 includes the oxide semiconductor, the leakage current that may flow into the gate electrode of the first transistor T1 may be prevented and the power consumption may be reduced. In an exemplary embodiment of the present disclosure, the semiconductor layer for each of the third transistor T3 and the fourth transistor T4 may include the oxide semiconductor.

Figure 3:
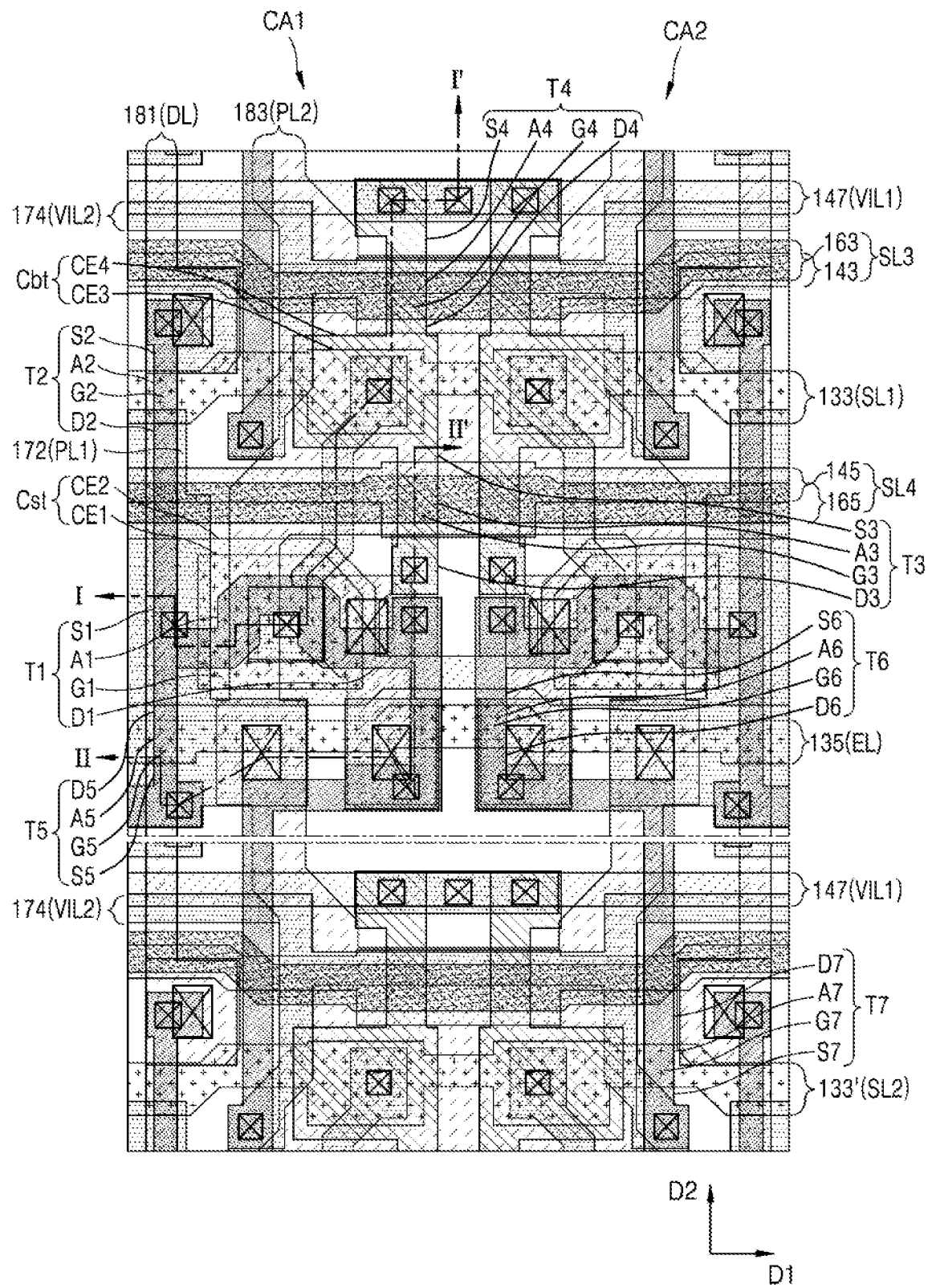
FIG. 3 is a layout diagram schematically illustrating the positions of a plurality of thin-film transistors (TFTs) and capacitors, which are arranged in a pair of pixel circuits of a display device, according to an exemplary embodiment of the present disclosure.
Figure 4:
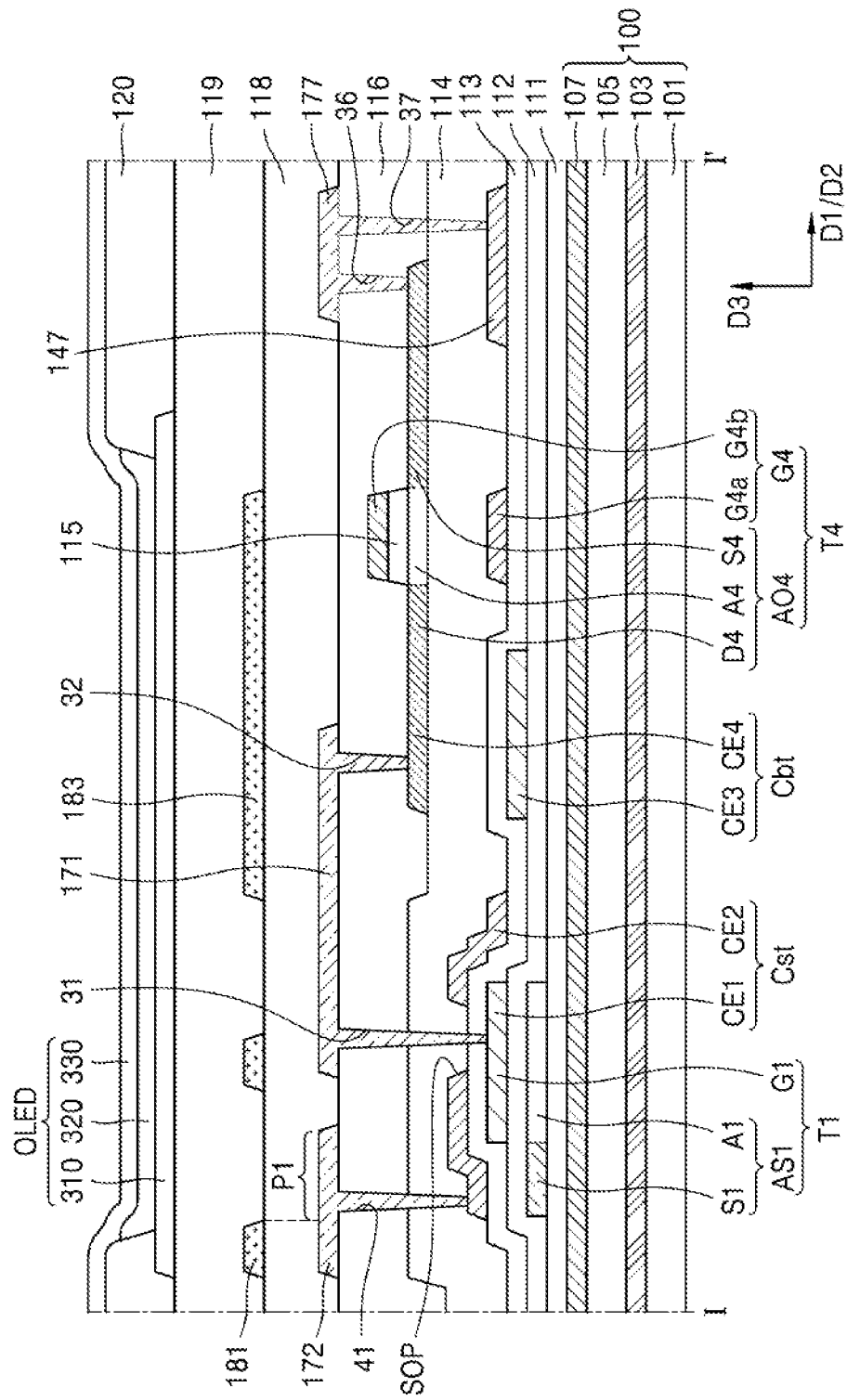
FIG. 4 is a schematic cross-sectional view of the display device taken along line I-I' of FIG. 3.
Figure 5:
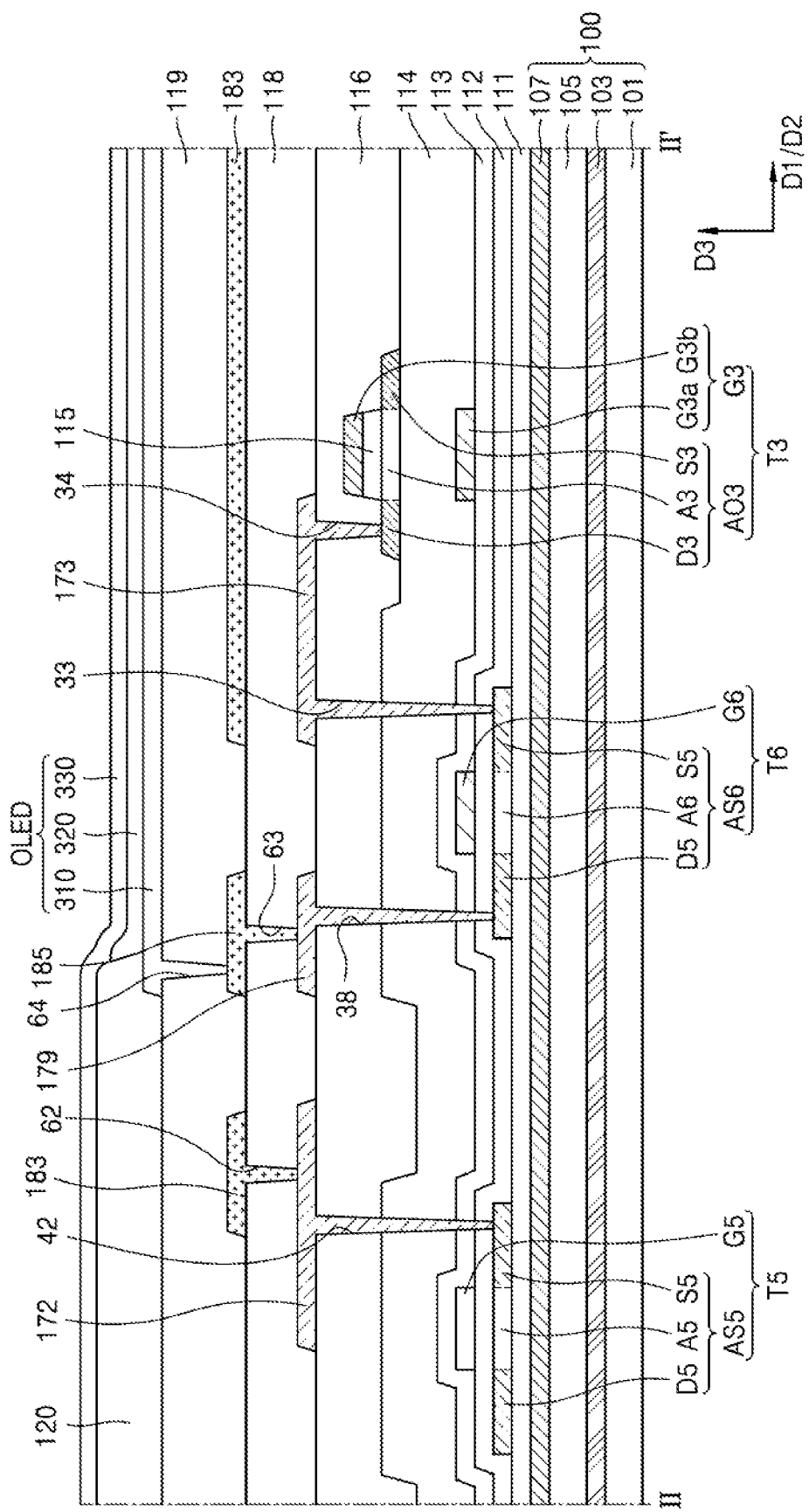
FIG. 5 is a schematic cross-sectional view of the display device taken along line II-II' of FIG. 3.
Figure 6A:
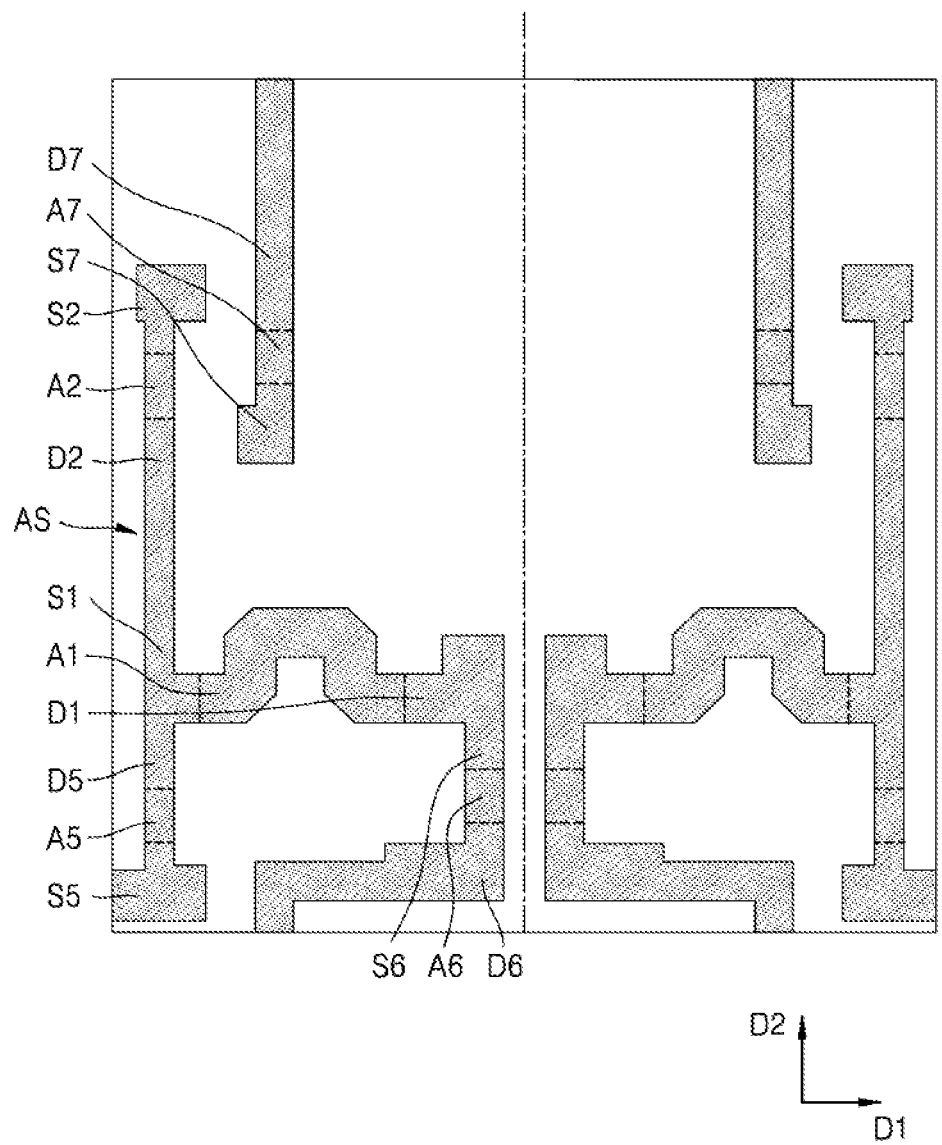
FIGS. 6A to 6G are schematic layout diagrams of elements of FIG. 3 for each layer.
Figure 7:
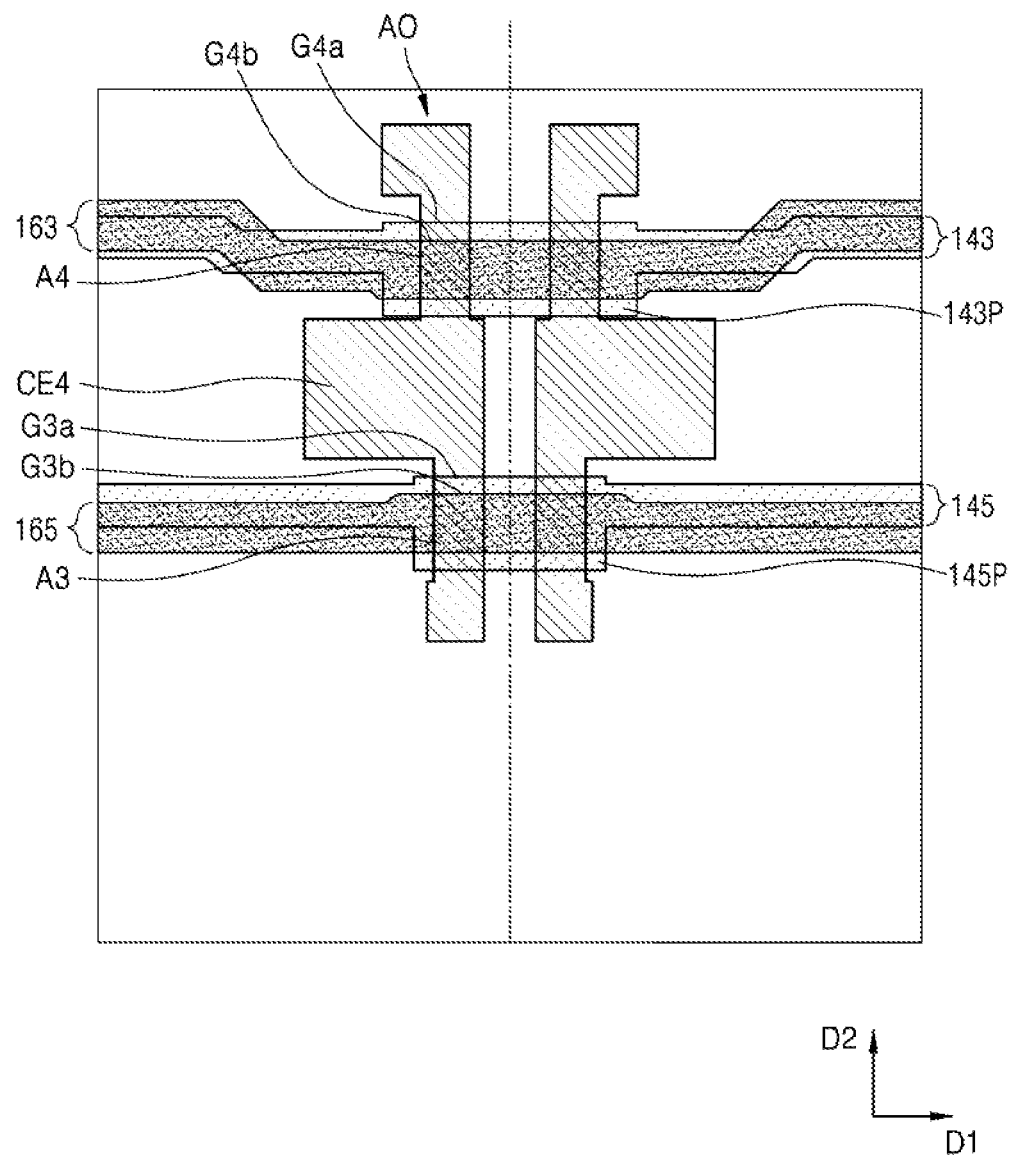
FIGS. 7 and 8 are layout diagrams illustrating only a partial configuration of FIG. 3.
Figure 8:
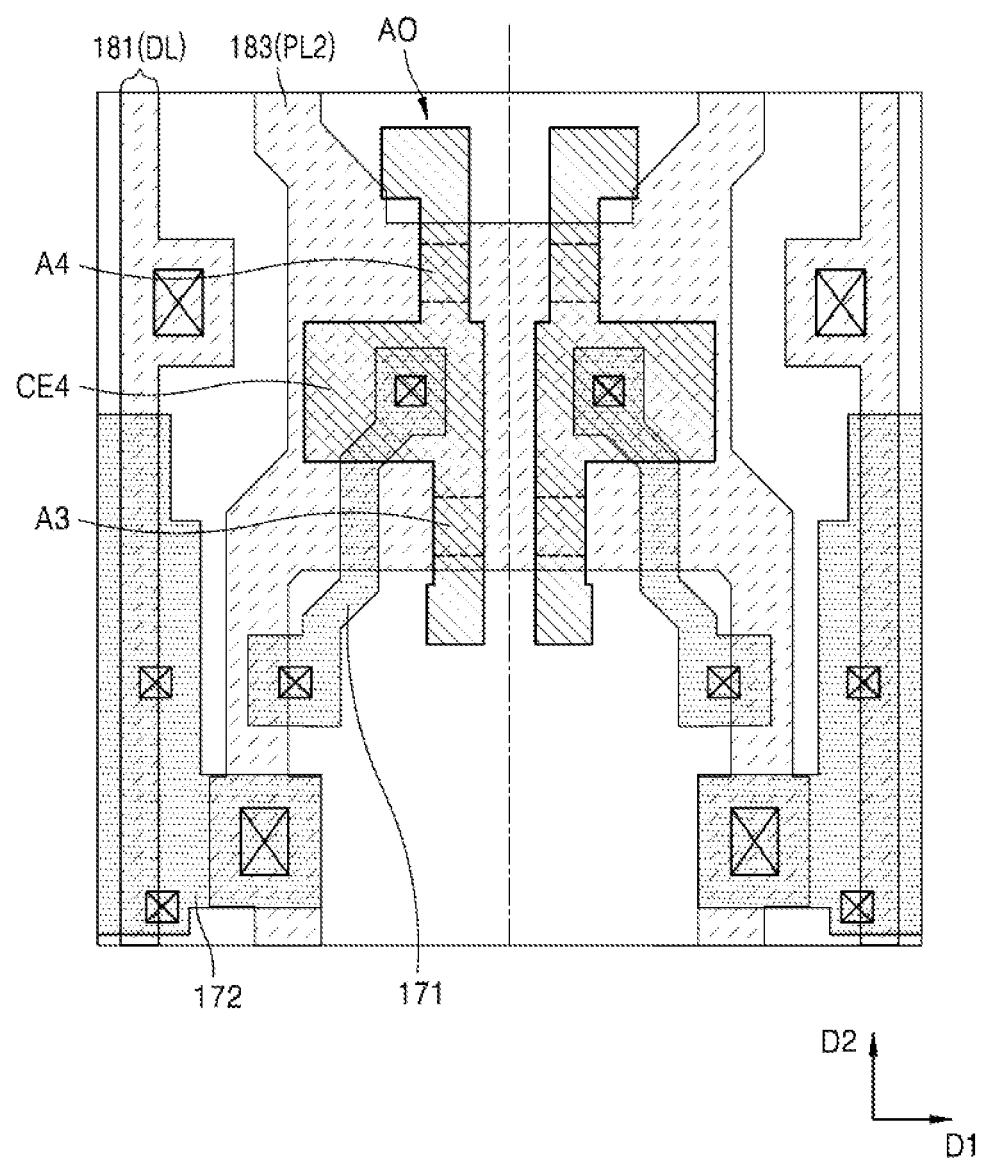

FIG. 3 is a layout diagram schematically illustrating the positions of a plurality of thin-film transistors (TFTs) and capacitors, which are arranged in a pair of pixel circuits of a display device, according to an exemplary embodiment of the present disclosure. FIG. 4 is a schematic cross-sectional view of the display device taken along line I-I' of FIG. 3, and FIG. 5 is a schematic cross-sectional view of the display device taken along line II-II' of FIG. 3. FIGS. 6A to 6G are schematic layout diagrams of elements of FIG. 3 for each layer. FIGS. 7 and 8 are layout diagrams illustrating only a partial configuration of FIG. 3. For example, FIG. 7 is a schematic layout diagram including a combination of the layout diagrams of three layers which include the schematic layout diagram of FIG. 6E, the schematic layout diagram of FIG. 6D, and a portion of the schematic layout diagram of FIG. 6C. FIG. 8 is a schematic layout diagram including a combination of the layout diagrams of three layers which include a portion of the schematic layout diagram of FIG. 6G, a portion of the schematic layout diagram of FIG. 6F, and the schematic layout diagram of FIG. 6D.

FIG. 3 illustrates pixel circuits of a pair of pixels (PX) arranged in the same row of adjacent columns. In FIG. 3, a pixel circuit of a pixel arranged in a left pixel area CA1 and a pixel circuit of a pixel arranged in a right pixel area CA2 have a bilaterally symmetrical structure.

Referring to FIG. 3, the pixel circuit of the display device according to an exemplary embodiment of the present disclosure may be connected to a first scan line 133 (SL1), a second scan line 133' (SL2), a third scan line SL3, a fourth scan line SL4, an emission control line 135 (EL), and an initialization voltage line, which extend in a first direction D1, and may be connected to a data line 181 (DL) and power supply voltage lines 172 (PL1) and 183 (PL2), which extend in a second direction D2 intersecting with the first direction D1. The initialization voltage line may include a first initialization voltage line 147 (VIL1) and a second initialization voltage line 174 (VIL2).

The pixel circuit may include a first transistor T1, a second transistor T2, a third transistor T3, a fourth transistor T4, a fifth transistor T5, a sixth transistor T6, a seventh transistor T7, a first capacitor Cst, and a second capacitor Cbt.

In an exemplary embodiment of the present disclosure, the first transistor T1, the second transistor T2, the fifth transistor T5, the sixth transistor T6, and the seventh transistor T7 may each include a TFT including silicon semiconductor. The third transistor T3 and the fourth transistor T4 may each include a TFT including oxide semiconductor.

The second scan line 133' may be the first scan line SL1 in the next row. That is, the first scan line 133 illustrated in FIG. 3 may be the second scan line SL2 of the previous row. Both the seventh transistor T7 connected to the pixel of the previous row and arranged in the pixel area of the current row and the seventh transistor T7 connected to the pixel of the current row and arranged in the pixel area of the next row are illustrated in FIG. 3. Hereinafter, for convenience of illustration and description, the seventh transistor T7 arranged in the pixel area of the current row will be described as an example.

The semiconductor layers of the first transistor T1, the second transistor T2, the fifth transistor T5, the sixth transistor T6, and the seventh transistor T7 may be arranged on the same layer and may include the same material. For example, the semiconductor layers may include polycrystalline silicon (p-Si). The semiconductor layers of the first transistor T1, the second transistor T2, the fifth transistor T5, the sixth transistor T6, and the seventh transistor T7 may be connected to each other and may be bent in various shapes. The semiconductor layers of the first transistor T1, the second transistor T2, the fifth transistor T5, the sixth transistor T6, and the seventh transistor T7 may be integrally formed, and thus may each be a portion of the integrally formed layer. The semiconductor layers of the first transistor T1, the second transistor T2, the fifth transistor T5, the sixth transistor T6, and the seventh transistor T7 being integrally formed, arranged on the same layer and bent in various shape are also illustrated in FIG. 6A to be described later.

The semiconductor layers of the first transistor T1, the second transistor T2, the fifth transistor T5, the sixth transistor T6, and the seventh transistor T7 may each include a channel region, and a source region and a drain region on both sides of the channel region. For example, the source region and the drain region may each be doped with impurities, and the impurities may include N-type impurities or P-type impurities. The source region and the drain region may correspond to a source electrode and a drain electrode, respectively. The source region and the drain region may be changed with each other according to characteristics of the transistor. Hereinafter, the terms "source region" and "drain region" are used instead of the source electrode and the drain electrode.

The first transistor T1 may include a first semiconductor layer and a first gate electrode G1. The first semiconductor layer may include a first channel region A1, and a first source region S1 and a first drain region D1 on both sides of the first channel region A1. Because the first semiconductor layer has a curved shape, the first channel region A1 may be longer than the other channel regions A2 to A7. For example, the first semiconductor layer may be bent a plurality of times, such as 'ᄃ', 'ᄅ', 'S', 'M', or 'W', thereby forming a long channel length in a narrow space. In an exemplary embodiment of the present disclosure, the first channel region A1 may be curved, and may have a meandering shape or a zigzag shape. Because the first channel region A1 is formed long, the driving range of the gate voltage applied to the first gate electrode G1 may be widened. Also, by forming the curved first channel region A1, the first channel region A1 may be formed to extend in a narrow space. Therefore, the gradation of light emitted from the OLED may be controlled more precisely, thereby enhancing display quality. In an exemplary embodiment of the present disclosure, the first semiconductor layer may have a straight shape instead of a bent shape. The first gate electrode G1 is an isolated pattern and may be provided to overlap the first channel region A1 with a first gate insulating layer (112 of FIG. 4) disposed therebetween. Thus, the first semiconductor layer may include silicon semiconductor, and the first gate electrode G1 may be insulated from the first semiconductor layer by the first gate insulating layer 112.

The first capacitor Cst may be arranged to overlap the first transistor T1, and may include a first electrode CE1 and a second electrode CE2. The first gate electrode G1 may function not only as the control electrode of the first transistor T1 but also as the first electrode CE1 of the first capacitor Cst. That is, the first gate electrode G1 and the first electrode CE1 may be integrally formed. The second electrode CE2 of the first capacitor Cst may be provided to overlap the first electrode CE1 with a second gate insulating layer (113 of FIG. 4) disposed therebetween. An area of the second electrode CE2 may be larger than an area of the first gate electrode G1, and the second electrode CE2 may cover all or part of the first gate electrode G1. In this case, the second gate insulating layer 113 may serve as a dielectric layer of the first capacitor Cst. The second gate insulating layer 113 may include a dielectric material, and storage capacitance may be determined by a charge charged in the first capacitor Cst and a voltage between first and second electrodes CE1 and CE2.

A node connection line 171 may be electrically connected to the first electrode CE1 of the first capacitor Cst and the third semiconductor layer AO3 of the third transistor T3. The node connection line 171 may also be electrically connected to the fourth electrode CE4 of the second capacitor Cbt and the fourth semiconductor layer AO4 of the fourth transistor T4. The second electrode CE2 may be electrically connected to the first power supply voltage line 172, and the first power supply voltage line 172 may be electrically connected to the second power supply voltage line 183. The first power supply voltage line 172 and the second power supply voltage line 183 may extend in the second direction D2. The second electrode CE2 may extend in the first direction D1 and may serve to transmit the first power supply voltage ELVDD in the first direction D1. Therefore, a plurality of first power supply voltage lines 172 and second power supply voltage lines 183 and a plurality of second electrodes CE2 in the display area DA may form a mesh structure.

The second transistor T2 may include a second semiconductor layer and a second gate electrode G2. The second semiconductor layer may include a second channel region A2, and a second source region S2 and a second drain region D2 on both sides of the second channel region A2. The second source region S2 may be electrically connected to the data line 181, and the second drain region D2 may be connected to the first source region S1. The second gate electrode G2 may be provided as part of the first scan line 133.

The fifth transistor T5 may include a fifth semiconductor layer AS5 and a fifth gate electrode G5. The fifth semiconductor layer AS5 may include a fifth channel region A5, and a fifth source region S5 and a fifth drain region D5 on both sides of the fifth channel region A5. The fifth source region S5 may be electrically connected to the first power supply voltage line 172, and the fifth drain region D5 may be connected to the first source region S1. The fifth gate electrode G5 may be provided as part of the emission control line 135.

The sixth transistor T6 may include a sixth semiconductor layer AS6 and a sixth gate electrode G6. The sixth semiconductor layer AS6 may include a sixth channel region A6, and a sixth source region S6 and a sixth drain region D6 on both sides of the sixth channel region A6. The sixth source region S6 may be connected to the first drain region D1, and the sixth drain region D6 may be electrically connected to a pixel electrode (310 of FIG. 5) of the OLED. The sixth gate electrode G6 may be provided as part of the emission control line 135.

The seventh transistor T7 may include a seventh semiconductor layer and a seventh gate electrode G7. The seventh semiconductor layer may include a seventh channel region A7, and a seventh source region S7 and a seventh drain region D7 on both sides of the seventh channel region A7. The seventh source region S7 may be electrically connected to the second initialization voltage line 174, and the seventh drain region D7 may be connected to the sixth drain region D6. The seventh gate electrode G7 may be provided as part of the second scan line 133'.

A first interlayer insulating layer (114 of FIG. 4) may be arranged on the first, second, and fifth to seventh transistors T1, T2, T5, T6, and T7 each including silicon semiconductor, and the third and fourth transistors T3 and T4 each including oxide semiconductor may be arranged on the first interlayer insulating layer 114.

The third semiconductor layer AO3 and the fourth semiconductor layer AO4 of the third transistor T3 and the fourth transistor T4, respectively, may be arranged on the same layer and may include the same material. For example, the third semiconductor layer AO3 and the fourth semiconductor layer AO4 may include oxide semiconductor.

The semiconductor layers may each include a channel region, and a source region and a drain region on both sides of the channel region. For example, the source region and the drain region may be regions in which carrier concentration is increased by plasma treatment. The source region and the drain region may correspond to a source electrode and a drain electrode, respectively. Hereinafter, the terms "source region" and "drain region" are used instead of the source electrode and the drain electrode.

The third transistor T3 may include a third semiconductor layer AO3 including oxide semiconductor and a third gate electrode G3. The third semiconductor layer AO3 may include a third channel region A3, and a third source region S3 and a third drain region D3 on both sides of the third channel region A3. The third source region S3 may be bridged to the first gate electrode G1 through the node connection line 171. Also, the third source region S3 may be connected to the fourth drain region D4 arranged on the same layer. The third drain region D3 may be electrically connected to the first semiconductor layer AS1 of the first transistor T1 and the sixth semiconductor layer AS6 of the sixth transistor T6. For example, one end of the connection electrode 173 may be connected to the third drain region D3 of the third transistor T3, and the other end of the connection electrode 173 may be connected to the sixth source region S6 of the sixth transistor T6. The third gate electrode G3 may be provided as part of the fourth scan line SL4.

The fourth transistor T4 may include a fourth semiconductor layer AO4 including oxide semiconductor and a fourth gate electrode G4. The fourth semiconductor layer AO4 may include a fourth channel region A4, and a fourth source region S4 and a fourth drain region D4 on both sides of the fourth channel region A4. The fourth source region S4 may be electrically connected to the first initialization voltage line 147 through the connection electrode 177 (see FIG.

4), and the fourth drain region D4 may be bridged to the first gate electrode G1 through the node connection line 171. The fourth gate electrode G4 may be provided as part of the third scan line SL3.

A third gate insulating layer (115 of FIGS. 4 and 5) may be arranged to correspond to the channel regions between the third semiconductor layer AO3 and the third gate electrode G3 and between the fourth semiconductor layer AO4 and the fourth gate electrode G4. Thus, the third and fourth semiconductor layers AO3 and AO4 may each include oxide semiconductor, and the third gate electrode G3 and the fourth gate electrode G4 may be insulated from the third semiconductor layer AO3 and the fourth semiconductor layer AO4, respectively, by the third gate insulating layer 115.

The third electrode CE3 of the second capacitor Cbt may be provided as part of the first scan line 133 and may be connected to the second gate electrode G2. For example, the third electrode CE3 may be arranged on a layer the same as that of the first gate electrode G1 (see FIG. 6B). The fourth electrode CE4 of the second capacitor Cbt may be arranged to overlap the third electrode CE3 and may include oxide semiconductor. The fourth electrode CE4 may be provided on a layer the same as that of the third semiconductor layer AO3 of the third transistor T3 and the fourth semiconductor layer AO4 of the fourth transistor T4, and may be an area between the third semiconductor layer AO3 and the fourth semiconductor layer AO4 (referring to FIGS. 4, 5 and 6D). Alternatively, the fourth electrode CE4 may be provided by extending from the fourth semiconductor layer AO4. Alternatively, the fourth electrode CE4 may be provided by extending from the third semiconductor layer AO3.

A second interlayer insulating layer (116 of FIGS. 4 and 5) may be arranged on the third and fourth transistors T3 and T4 each including oxide semiconductor, and a first power supply voltage line 172 and a node connection line 171 may be arranged on the second interlayer insulating layer 116.

A first planarization layer (118 of FIGS. 4 and 5) may be arranged on the first power supply voltage line 172, and a data line 181 and a second power supply voltage line 183 may extend in the second direction D2 and be arranged on the first planarization layer 118.

In an exemplary embodiment of the present disclosure, the first scan line 133, the second scan line 133', and the emission control line 135 may be arranged on a layer the same as that of the first gate electrode G1, and may include the same material.

In an exemplary embodiment of the present disclosure, some lines may include two conductive layers arranged on two different layers. For example, the third scan line SL3 may include a lower scan line 143 and an upper scan line 163 arranged on different layers. The lower scan line 143 may be arranged on a layer the same as that of the second electrode CE2 of the first capacitor Cst, and may include a material the same as that of the second electrode CE2 of the first capacitor Cst. The upper scan line 163 may be arranged on the third gate insulating layer (115 of FIG. 5). The lower scan line 143 may be arranged to at least partially overlap the upper scan line 163. The lower scan line 143 and the upper scan line 163 correspond to part of the third gate electrode G3 of the third transistor T3. Therefore, the third transistor T3 may have a double gate structure including control electrodes above and below the third semiconductor layer AO3, respectively.

The fourth scan line SL4 may include a lower scan line 145 and an upper scan line 165 arranged on different layers. The lower scan line 145 may be arranged on a layer the same as that of the second electrode CE2 of the first capacitor Cst, and may include a material the same as that of the second electrode CE2 of the first capacitor Cst. The upper scan line 165 may be arranged on the third gate insulating layer (115 of FIG. 4). The lower scan line 145 may be arranged to at least partially overlap the upper scan line 165. The lower scan line 145 and the upper scan line 165 correspond to part of the fourth gate electrode G4 of the fourth transistor T4. Therefore, the fourth transistor T4 may have a double gate structure including control electrodes above and below the semiconductor layer, respectively. The double gate structure may reduce leakage current by its unique property of electrical coupling of the two gates.

The initialization voltage line VIL may include a first initialization voltage line 147 and a second initialization voltage line 174 arranged on different layers. The first initialization voltage line 147 may be arranged on a layer the same as that of the second electrode CE2 of the first capacitor Cst, and may include a material the same as that of the second electrode CE2 of the first capacitor Cst. The second initialization voltage line 174 may be arranged on a layer the same as that of the first power supply voltage line 172, and may include a material the same as that of the first power supply voltage line 172.

Hereinafter, the structure of the display device, according to an exemplary embodiment of the present disclosure, will be described in detail according to a stacking order with reference to FIGS. 4 and 5.

FIGS. 4 and 5 illustrate the cross-section of portions corresponding to the first transistor T1, the third transistor T3, the fourth transistor T4, the fifth transistor T5, the sixth transistor T6, the first capacitor Cst, the second capacitor Cbt, and the OLED, and some members may be omitted.

The substrate 100 may include, for example, a glass material, a ceramic material, a metal material, or a flexible or bendable material. When the substrate 100 includes a flexible or bendable material, the substrate 100 may include a polymer resin, such as, for example, polyethersulphone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), or cellulose acetate propionate (CAP).

The substrate 100 may have a single-layered or multilayered structure including the above-described material. In the case of the multi-layered structure, the substrate 100 may further include an inorganic layer in addition to the layer including polymer resin. For example, the substrate 100 may include a first base layer 101, a first barrier layer 103, a second base layer 105, and a second barrier layer 107. The first base layer 101 and the second base layer 105 may each include a polymer resin. For example, the first base layer 101 and the second base layer 105 may each include a transparent polymer resin. The first barrier layer 103 and the second barrier layer 107 are each a barrier layer for preventing penetration of external foreign substances. For example, the first barrier layer 103 and the second barrier layer 107 may each be a single layer or a multi-layer including an inorganic material such as, for example, silicon nitride ($SiN_x$), silicon oxide ($SiO_x$) and/or silicon oxynitride (SiON).

A buffer layer 111 may be arranged on the substrate 100. The buffer layer 111 may serve to increase the smoothness of the upper surface of the substrate 100 and may include an oxide layer such as silicon oxide ($SiO_x$), and/or a nitride layer such as, for example, silicon nitride ($SiN_x$), or silicon oxynitride (SiON).

A barrier layer may be further included between the substrate 100 and the buffer layer 111. The barrier layer may serve to prevent or minimize impurities from penetrating from the substrate 100 or the like into the semiconductor layer. The buffer layer 111 may include an inorganic material such as oxide or nitride, and/or an organic material, and may have a single-layered structure or a multi-layered structure including the inorganic material and the organic material.

As illustrated in FIG. 6A, the semiconductor layers AS of the first transistor T1, the second transistor T2, the fifth transistor T5, the sixth transistor T6, and the seventh transistor T7 may be arranged on the buffer layer 111.

The semiconductor layers AS may include a channel region A1, a source region S1, and a drain region D1, which are a first semiconductor layer AS1 of the first transistor T1, a channel region A2, a source region S2, and a drain region D2, which are a second semiconductor layer of the second transistor T2, a channel region A5, a source region S5, and a drain region D5, which are a fifth semiconductor layer AS5 of the fifth transistor T5, a channel region A6, a source region S6, and a drain region D6, which are a sixth semiconductor layer AS6 of the sixth transistor T6, and a channel region A7, a source region S7, and a drain region D7, which are a seventh semiconductor layer of the seventh transistor T7. That is, each channel region, each source region, and each drain region of the first to second and fifth to seventh transistors T1 to T2 and T5 to T7 may be partial regions of the semiconductor layers AS. For example, the semiconductor layers of the first transistor T1, the second transistor T2, the fifth transistor T5, the sixth transistor T6, and the seventh transistor T7 may be integrally formed, arranged on the same layer and bent in various shape. In FIG. 6A, the semiconductor layer of the seventh transistor T7 may be a partial region of the semiconductor layer extending from the previous row.

The first gate insulating layer 112 may be arranged on the semiconductor layer AS. The first gate insulating layer 112 may include an inorganic material including oxide or nitride. For example, the first gate insulating layer 112 may include at least one selected from, for example, silicon oxide ($SiO_x$), silicon nitride ($SiN_x$), silicon oxynitride (SiON), aluminum oxide ($Al_2O_3$), titanium oxide ($TiO_2$), lanthanum oxide ($La_2O_3$), zirconium oxide ($ZrO_2$), tantalum oxide ($Ta_2O_5$), hafnium oxide ($HfO_2$), and zinc oxide (ZnO).

Figure 6B:
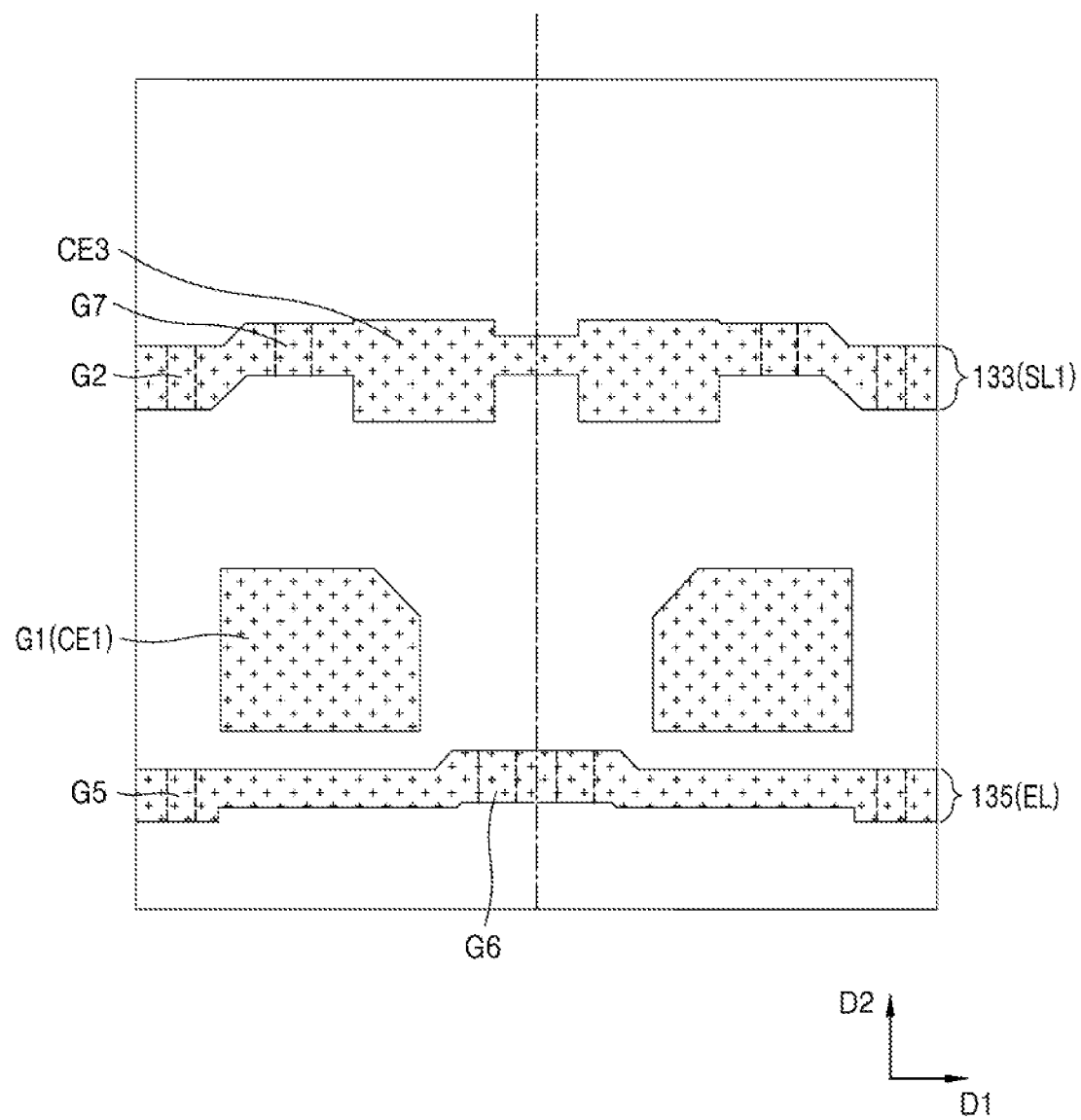

As illustrated in FIG. 6B, the gate electrode G1 of the first transistor T1, the gate electrode G2 of the second transistor T2, the gate electrode G5 of the fifth transistor T5, the gate electrode G6 of the sixth transistor T6, and the gate electrode G7 of the seventh transistor T7 may be arranged on the first gate insulating layer 112. Also, the first scan line 133 and the emission control line 135 may extend on the first gate insulating layer 112 in the first direction D1. Part of the first scan line 133 may be the third electrode CE3 of the second capacitor Cbt.

The gate electrode G1 of the first transistor T1 may be provided in an island type. The gate electrode G2 of the second transistor T2 may be part of the first scan line 133 intersecting with the semiconductor layer AS, for example, overlapping the second channel region A2. The gate electrode G7 of the seventh transistor T7 may be part of the first scan line 133 intersecting with the semiconductor layer AS or part of the second scan line (133' of FIG. 3), which is the first scan line in the next row. FIG. 6B illustrates an example in which the gate electrode G7 of the seventh transistor T7 of the pixel arranged in the previous row is part of the first scan line 133 intersecting with the semiconductor layer AS, for example, overlapping the seventh channel region A7.

The gate electrode G5 of the fifth transistor T5 and the gate electrode G6 of the sixth transistor T6 may be parts of the emission control line 135 intersecting with the semiconductor layer AS, for example, overlapping the fifth channel region A5 and overlapping the sixth channel region A6, respectively.

The gate electrode G1 of the first transistor T1 may function not only as the control electrode of the first transistor T1, but also as the first electrode CE1 of the first capacitor Cst.

The gate electrodes of the first transistor T1, the second transistor T2, the fifth transistor T5, the sixth transistor T6, and the seventh transistor T7 may include, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), and may be a single layer or a multi-layer including one or more materials.

The second gate insulating layer 113 may be arranged on the gate electrodes. The second gate insulating layer 113 may include an inorganic material including oxide or nitride. For example, the second gate insulating layer 113 may include at least one selected from, for example, silicon oxide ($SiO_x$), silicon nitride ($SiN_x$), silicon oxynitride (SiON), aluminum oxide ($Al_2O_3$), titanium oxide ($TiO_2$), lanthanum oxide ($La_2O_3$), zirconium oxide ($ZrO_2$), tantalum oxide ($Ta_2O_5$), hafnium oxide ($HfO_2$), and zinc oxide (ZnO).

Figure 6C:
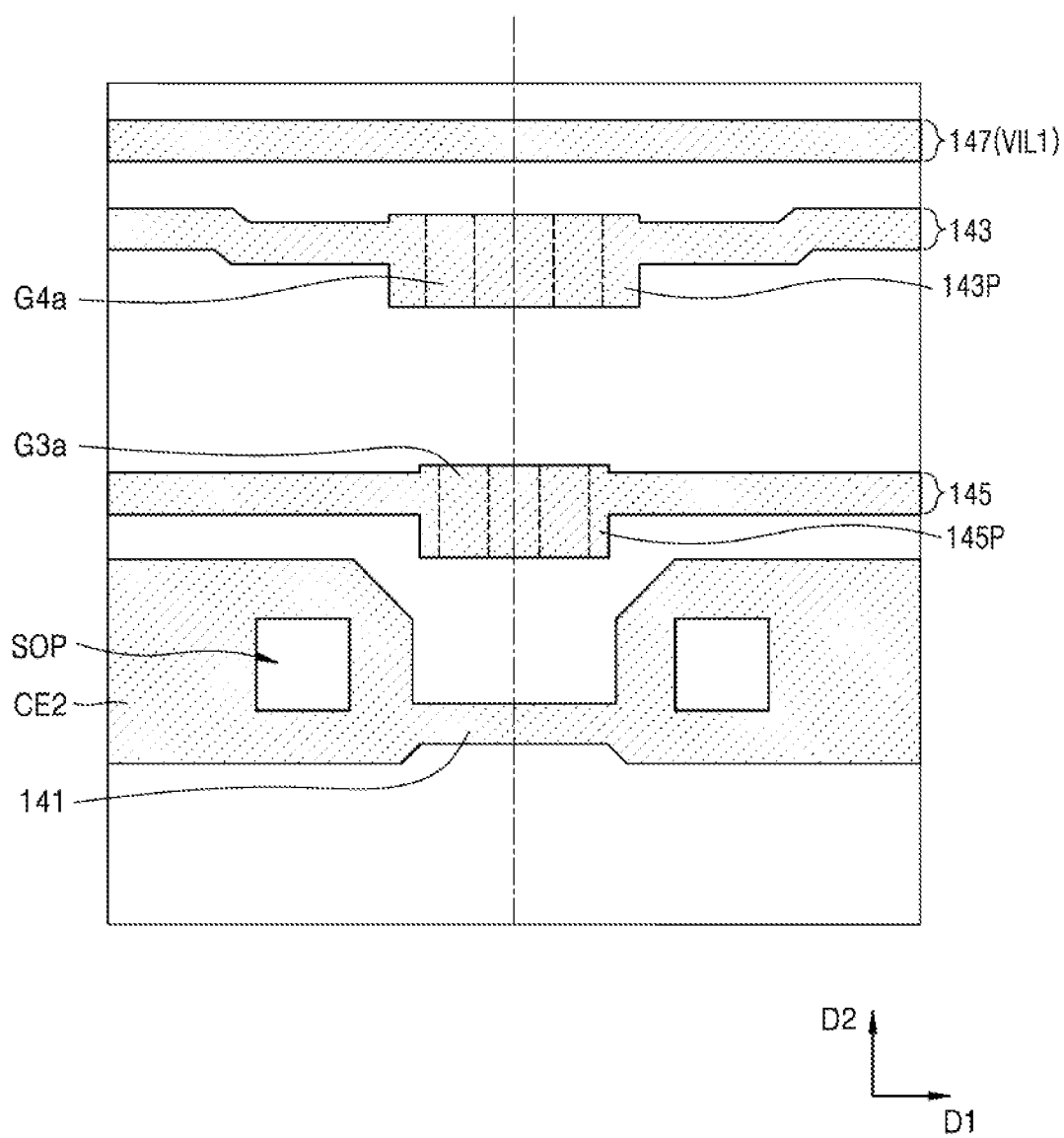

As illustrated in FIG. 6C, the second electrode CE2 may be arranged on the second gate insulating layer 113 to overlap the first electrode CE1. An area of the second electrode CE2 may be larger than an area of the first electrode CE1. The second electrode CE2 may include an opening SOP. The opening SOP may be defined by removing part of the second electrode CE2 and may have a closed shape.

The second gate insulating layer 113 may serve as a dielectric layer of the first capacitor Cst. The second electrodes CE2 of the adjacent pixels may be connected to each other by a bridge 141. The bridge 141 may be a portion protruding from the second electrode CE2 in the first direction D1 and may be integrally formed with the second electrode CE2.

The second electrode CE2 of the first capacitor Cst may be a single layer or a multi-layer including at least one selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The first initialization voltage line 147, the lower scan line 143 of the third scan line SL3, and the lower scan line 145 of the fourth scan line SL4 may include a material the same as that of the second electrode CE2 of the first capacitor Cst, may extend in the first direction D1, and may be arranged on the second gate insulating layer 113. A portion overlapping a semiconductor layer AO, for example, overlapping the fourth channel region A4, in the lower scan line 143 of the third scan line SL3 may be a lower gate electrode G4a of the fourth transistor T4. A portion overlapping the semiconductor layer AO, for example, overlapping the third channel region A3, in the lower scan line 145 of the fourth scan line SL4 may be a lower gate electrode G3a of the third transistor T3. For example, the first capacitor Cst may include the first electrode CE1 arranged on a layer the same as that of the first gate electrode G1 (referring to FIG. 6B, the first gate electrode G1 functioning as the first electrode CE1), and the second electrode CE2 arranged above the first electrode CE1, in which the second electrode CE2 is arranged on a layer the same as that of the lower gate electrode G3a of the third transistor T3 and that of the lower gate electrode G4a of the fourth transistor T4 (referring to FIG. 6C).

The first interlayer insulating layer 114 may be arranged on the second electrode CE2 of the first capacitor Cst, and may include an inorganic material including oxide or nitride. For example, the first interlayer insulating layer 114 may include at least one selected from, for example, silicon oxide ($SiO_x$), silicon nitride ($SiN_x$), silicon oxynitride (SiON), aluminum oxide ($Al_2O_3$), titanium oxide ($TiO_2$), lanthanum oxide ($La_2O_3$), zirconium oxide ($ZrO_2$), tantalum oxide ($Ta_2O_5$), hafnium oxide ($HfO_2$), and zinc oxide (ZnO).

Figure 6D:
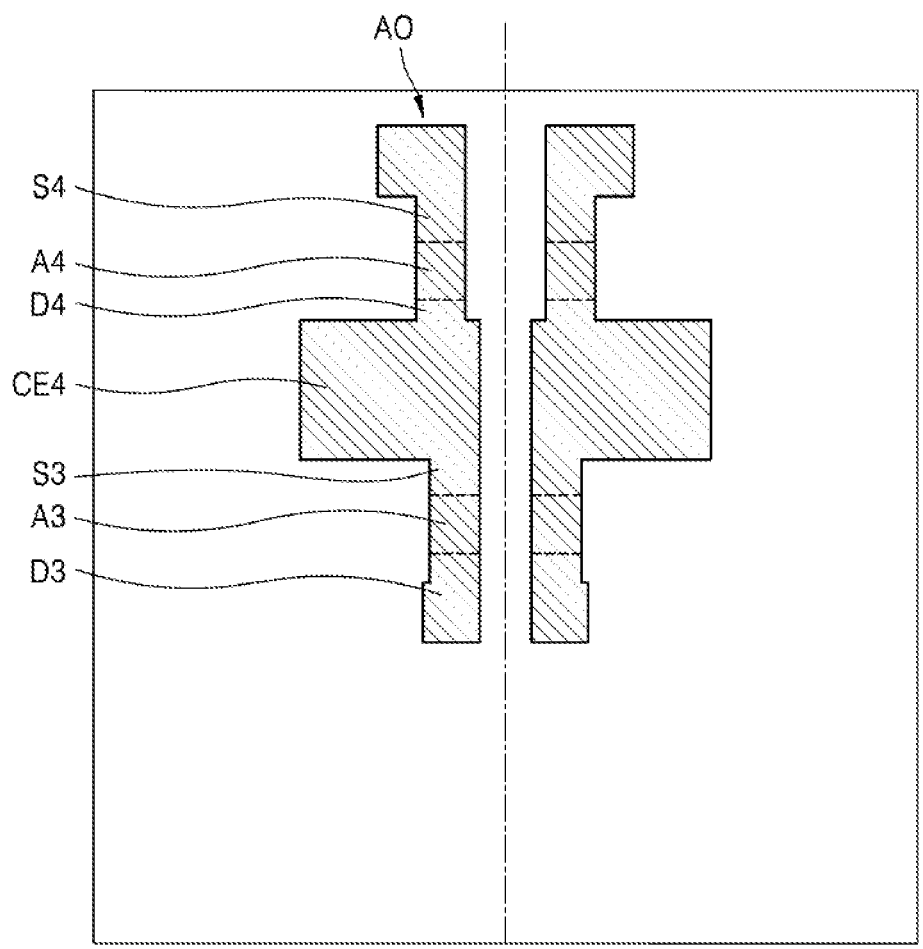

As illustrated in FIG. 6D, the semiconductor layer AO including oxide semiconductor may be arranged on the first interlayer insulating layer 114, and may include a Zinc (Zn) oxide-based material, for example, Zn oxide, In—Zn oxide, Ga—In—Zn oxide, and the like. In an exemplary embodiment of the present disclosure, the semiconductor layer AO may include In—Ga—Zn—O (IGZO), In—Sn—Zn—O (ITZO), or In—Ga—Sn—Zn—O (IGTZO) semiconductor, in which a metal such as indium (In), gallium (Ga), or tin (Sn) is included in zinc oxide (ZnO).

The semiconductor layers of the third transistor T3 and the fourth transistor T4 may each include a channel region, and a source region and a drain region on both sides of the channel region. The source regions and the drain regions of the third transistor T3 and the fourth transistor T4 may be formed by adjusting the carrier concentration of the oxide semiconductor so as to make the source regions and the drain regions conductive. For example, the source regions and the drain regions of the third transistor T3 and the fourth transistor T4 may be formed by increasing the carrier concentration through performing plasma treatment on oxide semiconductor with hydrogen (H)-based gas, fluorine (F)-based gas, or a combination thereof.

The semiconductor layer AO may include a channel region A3, a source region S3, and a drain region D3, which are a third semiconductor layer AO3 of the third transistor T3, and a channel region A4, a source region S4, and a drain region D4, which are a fourth semiconductor layer AO4 of the fourth transistor T4. That is, each channel region, each source region, and each drain region of the third transistor T3 and the fourth transistor T4 may be partial regions of the semiconductor layer AO. For example, the semiconductor layer AO (i.e., the third and fourth semiconductor layers AO3 and AO4) of the third transistor T3 and the fourth transistor T4 may be integrally formed, arranged on the same layer and bent in various shape. The source region S4 of the fourth transistor T4 may overlap the first initialization voltage line 147, and may be electrically connected to the first initialization voltage line 147 through the connection electrode 177 (see FIG. 4).

The semiconductor layer AO may also include the fourth electrode CE4 of the second capacitor Cbt. The fourth electrode CE4 of the second capacitor Cbt may be arranged between the third semiconductor layer AO3 of the third transistor T3 and the fourth semiconductor layer AO4 of the fourth transistor T4. The fourth electrode CE4 may be provided to extend from the third semiconductor layer AO3 of the third transistor T3 or the fourth semiconductor layer AO4 of the fourth transistor T4. For example, the fourth electrode CE4 may be a partial region of the semiconductor layer AO. That is, the fourth electrode CE4 may include oxide semiconductor and may be arranged on the first interlayer insulating layer 114. The second gate insulating layer 113 and the first interlayer insulating layer 114 may be arranged between the third electrode CE3 and the fourth electrode CE4 of the second capacitor Cbt, and the second gate insulating layer 113 and the first interlayer insulating layer 114 may function as the dielectric layer of the second capacitor Cbt.

Figure 6E:
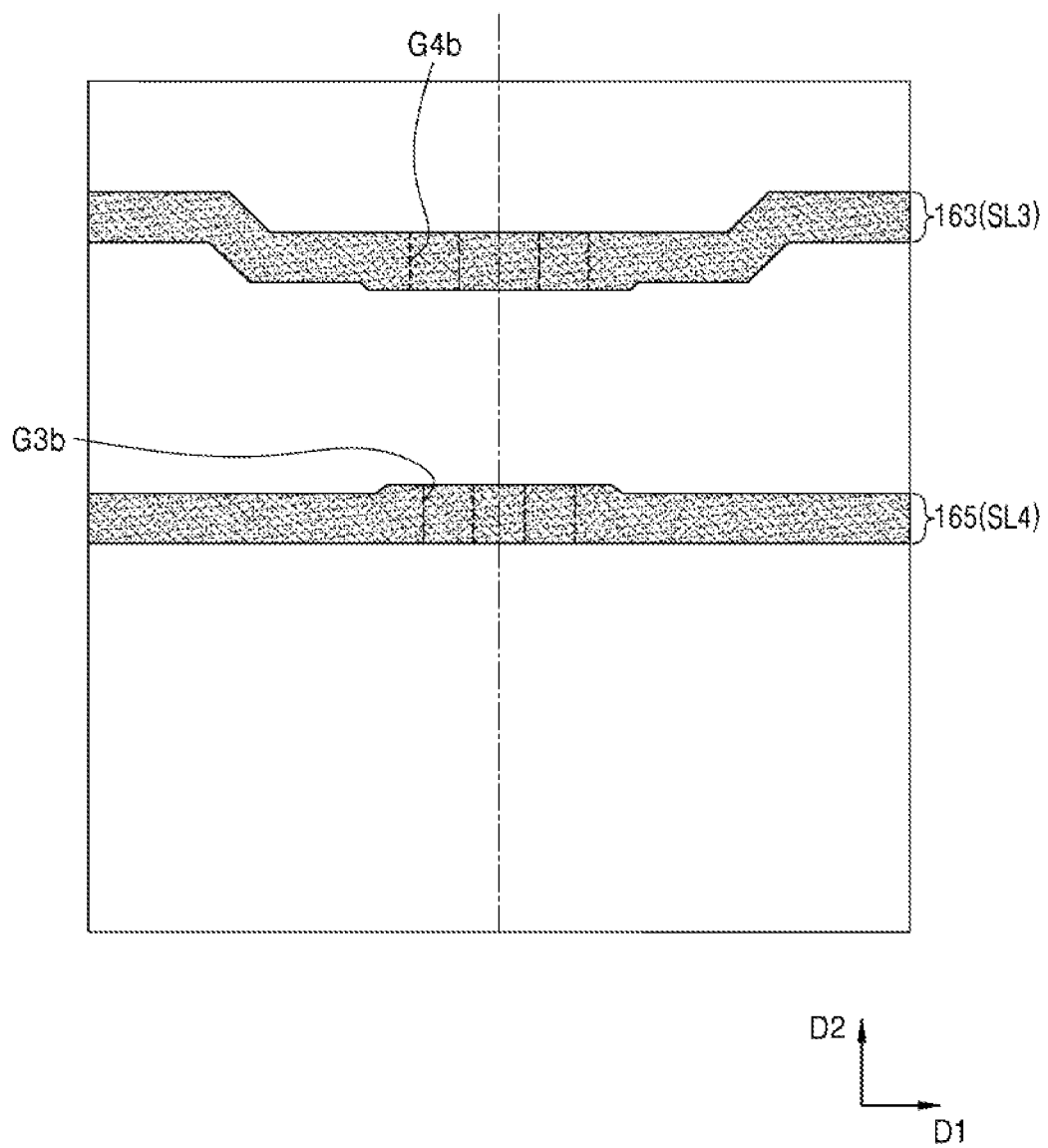

As illustrated in FIG. 6E, the upper scan line 163 of the third scan line SL3 and the upper scan line 165 of the fourth scan line SL4 may extend in the first direction D1 and be arranged on the semiconductor layer AO. That is, the third scan line SL3 and the fourth scan line SL4 may each include two conductive layers arranged on different layers.

The upper scan line 163 of the third scan line SL3 may be arranged to at least partially overlap the lower scan line 143. The upper scan line 165 of the fourth scan line SL4 may be arranged to at least partially overlap the lower scan line 145. A third gate insulating layer 115 may be arranged between the semiconductor layer AO and the upper scan line 163 of the third scan line SL3 and between the semiconductor layer AO and the upper scan line 165 of the fourth scan line SL4. The third gate insulating layer 115 may be formed by patterning in a shape corresponding to the upper scan line 163 of the third scan line SL3 and the upper scan line 165 of the fourth scan line SL4.

A portion overlapping the fourth semiconductor layer AO4, for example, overlapping the fourth channel region A4, in the upper scan line 163 of the third scan line SL3 may be an upper gate electrode G4b of the fourth transistor T4. A portion overlapping the third semiconductor layer AO3, for example, overlapping the third channel region A3, in the upper scan line 165 of the fourth scan line SL4 may be an upper gate electrode G3b of the third transistor T3. That is, the third transistor T3 and the fourth transistor T4 may have a double gate structure in which control electrodes are provided above and below the semiconductor layer. The double gate structure may reduce leakage current by its unique property of electrical coupling of the two gates.

The third gate insulating layer 115 may include an inorganic material including oxide or nitride. For example, the third gate insulating layer 115 may include at least one selected from, for example, silicon oxide ($SiO_x$), silicon nitride ($SiN_x$), silicon oxynitride (SiON), aluminum oxide ($Al_2O_3$), titanium oxide ($TiO_2$), lanthanum oxide ($La_2O_3$), zirconium oxide ($ZrO_2$), tantalum oxide ($Ta_2O_5$), hafnium oxide ($HfO_2$), and zinc oxide (ZnO). The upper gate electrode G3b of the third transistor T3 and the upper gate electrode G4b of the fourth transistor T4 may be arranged on the third gate insulating layer 115 and may be a single layer or a multi-layer including at least one selected from, for example, molybdenum (Mo), copper (Cu), and titanium (Ti).

FIG. 7 is a schematic layout diagram including a combination of the layout diagrams of three layers which include the schematic layout diagram of FIG. 6E, the schematic layout diagram of FIG. 6D, and a portion of the schematic layout diagram of FIG. 6C. As illustrated in FIG. 7, the lower scan line 143 of the third scan line SL3 may include a protrusion 143p. The protrusion 143p may be arranged to cover the channel region A4 of the fourth semiconductor layer AO4 below the fourth semiconductor layer (AO4 of FIG. 4) of the fourth transistor T4 and may serve to block light that may be applied from the bottom of the substrate 100.

The lower scan line 145 of the fourth scan line SL4 may have a protrusion 145p. The protrusion 145p may be arranged to cover the channel region A3 of the third semiconductor layer AO3 below the third semiconductor layer (AO3 of FIG. 5) of the third transistor T3 and may serve to block light that may be applied from the bottom of the substrate 100.

Figure 6F:
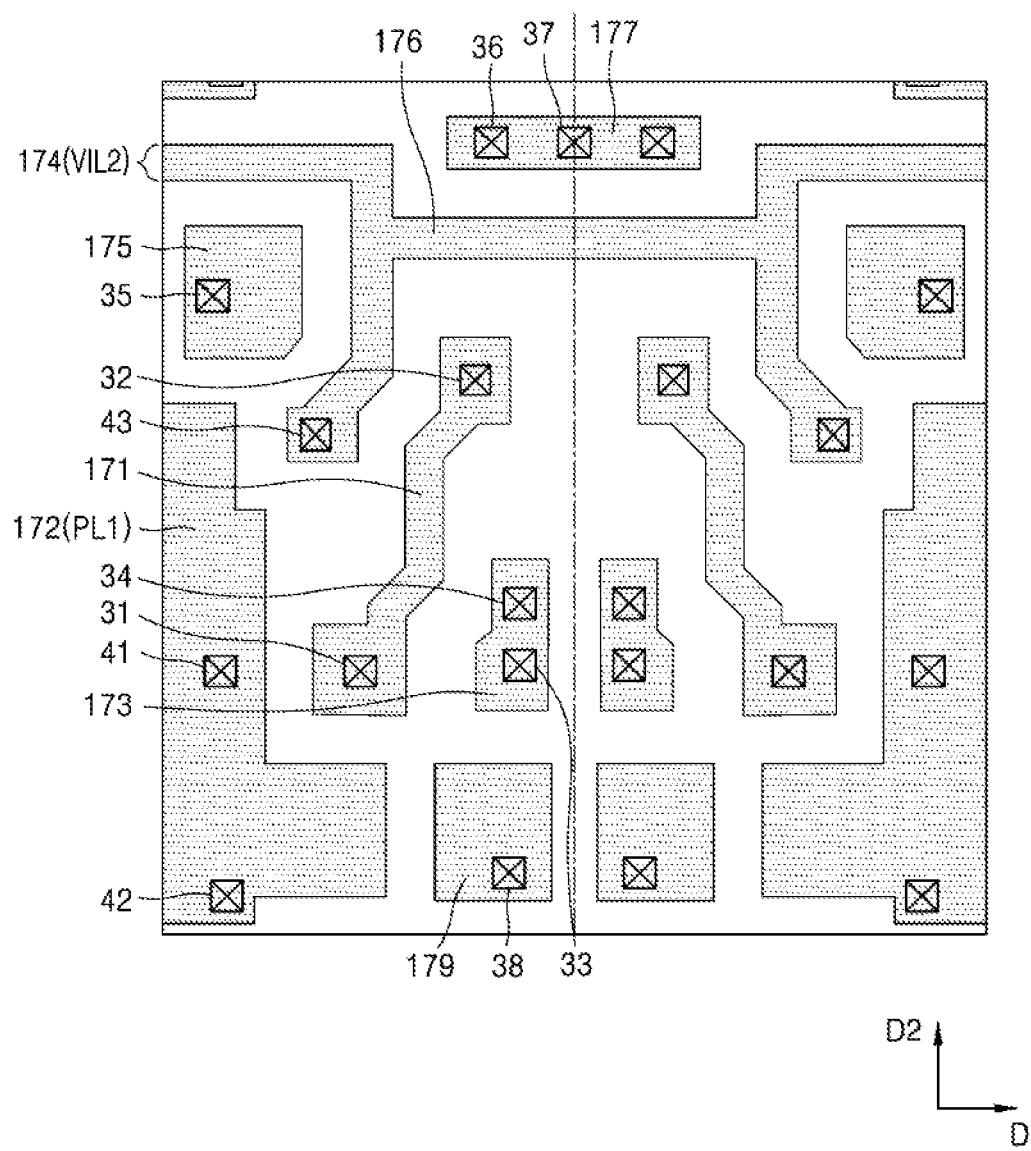

The second interlayer insulating layer 116 may be arranged while covering the third transistor T3 and the fourth transistor T4, and may be arranged on the upper gate electrode G3b of the third transistor T3 and the upper gate electrode G4b of the fourth transistor T4. As illustrated in FIG. 6F, the first power supply voltage line 172, the second initialization voltage line 174, the node connection line 171, and the connection electrodes 173, 175, 177, and 179 may be arranged on the second interlayer insulating layer 116.

The second interlayer insulating layer 116 may include an inorganic material including oxide or nitride. For example, the second interlayer insulating layer 116 may include at least one selected from, for example, silicon oxide ($SiO_x$), silicon nitride ($SiN_x$), silicon oxynitride (SiON), aluminum oxide ($Al_2O_3$), titanium oxide ($TiO_2$), lanthanum oxide ($La_2O_3$), zirconium oxide ($ZrO_2$), tantalum oxide ($Ta_2O_5$), hafnium oxide ($HfO_2$), and zinc oxide (ZnO).

The first power supply voltage line 172, the second initialization voltage line 174, the node connection line 171, and the connection electrodes 173, 175, 177, and 179 may each include a material having high conductivity, such as a metal or a conductive oxide. For example, the first power supply voltage line 172, the second initialization voltage line 174, the node connection line 171, and the connection electrodes 173, 175, 177, and 179 may each be a single layer or a multi-layer including at least one selected from, for example, aluminum (Al), copper (Cu), and titanium (Ti). In an exemplary embodiment of the present disclosure, the first power supply voltage line 172, the second initialization voltage line 174, the node connection line 171, and the connection electrodes 173, 175, 177, and 179 may each include a triple layer in which titanium, aluminum, and titanium (Ti/Al/Ti) are sequentially arranged.

The first power supply voltage line 172 may be connected to the second electrode CE2 of the first capacitor Cst through contact holes 41 formed in the first interlayer insulating layer 114 and the second interlayer insulating layer 116 (see FIG. 4). The first power supply voltage line 172 may be connected to the fifth drain region D5 of the fifth transistor T5 through contact holes 42 formed in the first gate insulating layer 112, the second gate insulating layer 113, the first interlayer insulating layer 114, and the second interlayer insulating layer 116 (see FIG. 5).

The second initialization voltage line 174 may be connected to the seventh drain region D7 of the seventh transistor T7 through contact holes 43 formed in the first gate insulating layer 112, the second gate insulating layer 113, the first interlayer insulating layer 114, and the second interlayer insulating layer 116.

One end of the node connection line 171 may be connected to the first gate electrode G1 through a contact hole 31 (see FIG. 4). The contact hole 31 may penetrate through the second interlayer insulating layer 116, the first interlayer insulating layer 114, and the second gate insulating layer 113 and expose the first gate electrode G1. Part of the node connection line 171 may be inserted into the contact hole 31 so as to be electrically connected to the first gate electrode G1.

The contact hole 31 may be spaced apart from an edge of an opening SOP of the second electrode CE2, and the node connection line 171 inserted into the contact hole 31 may be electrically insulated from the second electrode CE2.

The other end of the node connection line 171 may be electrically connected through the contact hole 32 to the oxide semiconductor layer AO, for example, the fourth electrode CE4 of the second capacitor Cbt, the fourth semiconductor layer AO4, or the third semiconductor layer AO3. For example, the first gate electrode G1, which is also the first electrode CE1 of the first capacitor Cst, may be electrically connected to the fourth electrode CE4 of the second capacitor Cbt, the fourth drain region D4 of the fourth transistor T4 and the third source region S3 of the third transistor T3 through the node connection line 171. The contact hole 32 may penetrate through the second interlayer insulating layer 116 so as to expose the oxide semiconductor layer.

The fourth electrode CE4 of the second capacitor Cbt may be connected to the node connection line 171 so as to be electrically connected to the first gate electrode G1. Therefore, when the first scan signal Sn supplied to the first scan line 133 (SL1) is turned off, the second capacitor Cbt may increase the voltage of the node (N2 of FIG. 2) so that the black gradation is clearly expressed.

One end of the connection electrode 173 may be connected to the first drain region D1 of the first transistor T1 and the sixth source region S6 of the sixth transistor T6 through a contact hole 33 (see FIG. 5). The contact hole 33 may penetrate through the first gate insulating layer 112, the second gate insulating layer 113, the first interlayer insulating layer 114, and the second interlayer insulating layer 116 so as to expose the silicon semiconductor layer. The other end of the connection electrode 173 may be connected to the third drain region D3 of the third transistor T3 through a contact hole 34. For example, the first drain region D1 of the first transistor T1 and the sixth source region S6 of the sixth transistor T6 in the silicon semiconductor layer AS may be electrically connected to the third drain region D3 of the third transistor T3 in the oxide semiconductor layer AO through the connection electrode 173. The contact hole 34 may penetrate through the second interlayer insulating layer 116 so as to expose the oxide semiconductor layer.

The connection electrode 175 may be connected to the second source region S2 of the second transistor T2 through contact holes 35 formed in the first gate insulating layer 112, the second gate insulating layer 113, the first interlayer insulating layer 114, and the second interlayer insulating layer 116.

Part of the connection electrode 177 may be connected to the fourth source region S4 of the fourth transistor T4 through a contact hole 36 formed in the second interlayer insulating layer 116 (see FIG. 4). The other part of the connection electrode 177 may be connected to the first initialization voltage line 147 through contact holes 37 formed in the first interlayer insulating layer 114 and the second interlayer insulating layer 116.

The connection electrode 179 may be connected to the drain region D6 of the sixth transistor T6 through contact holes 38 formed in the first gate insulating layer 112, the second gate insulating layer 113, the first interlayer insulating layer 114, and the second interlayer insulating layer 116 (see FIG. 5).

A first planarization layer 118 may be arranged on the first power supply voltage line 172, the second initialization voltage line 174, the node connection line 171, and the connection electrodes 173, 175, 177, and 179.

Figure 6G:
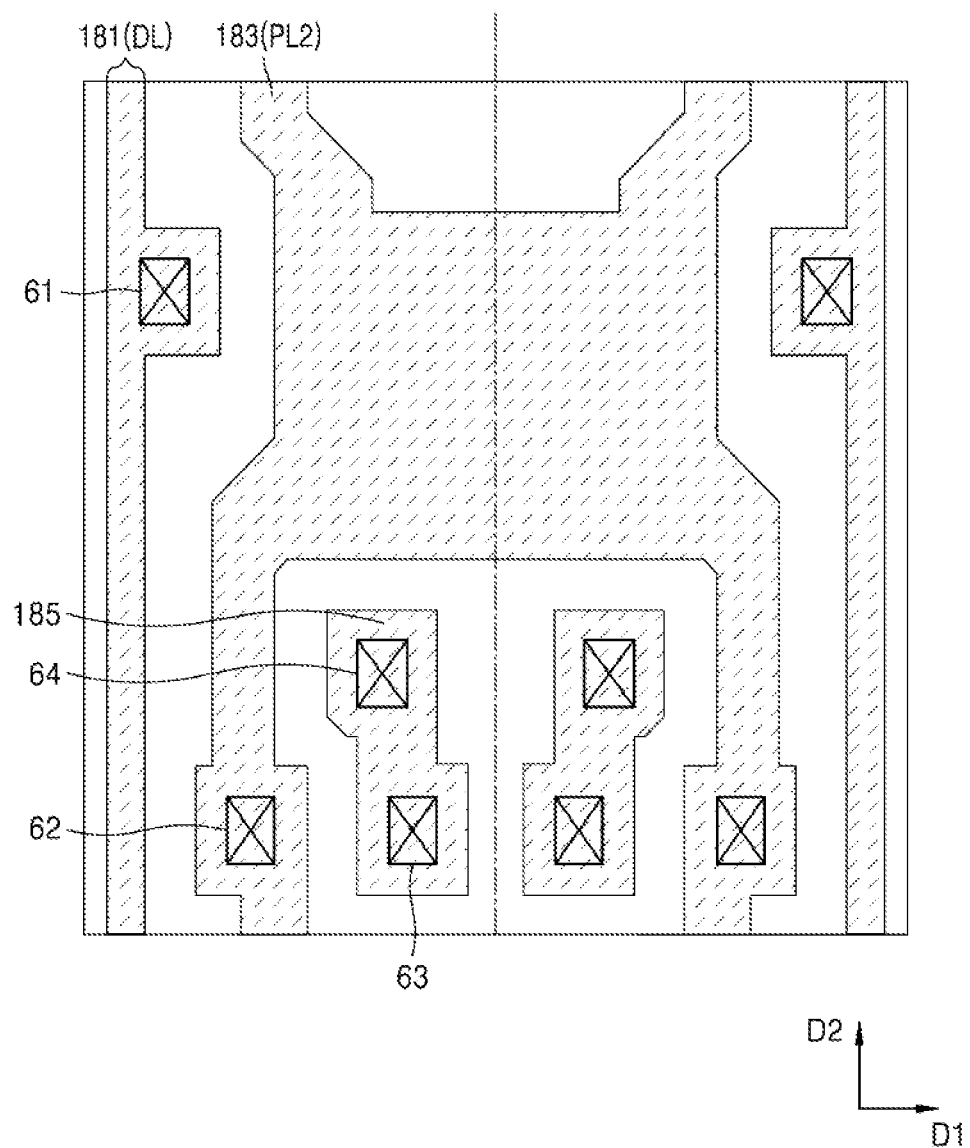

As illustrated in FIG. 6G, a data line 181, a second power supply voltage line 183, and a connection electrode 185 may be arranged on the first planarization layer 118.

The data line 181 may be connected to the connection electrode 175 through a contact hole 61 formed in the first planarization layer 118 so as to be connected to the second source region S2 of the second transistor T2. FIG. 8 is a schematic layout diagram including a combination of the layout diagrams of three layers which include a portion of the schematic layout diagram of FIG. 6G, a portion of the schematic layout diagram of FIG. 6F, and the schematic layout diagram of FIG. 6D. As illustrated in FIG. 8, the data line 181 may be arranged to partially overlap the first power supply voltage line 172. As illustrated in FIG. 4, when seen in a cross-sectional view, the first power supply voltage line 172 may be arranged between the first gate electrode G1 of the first transistor T1 and the data line 181. When seen in a plan view, a portion P1 (see FIG. 4) of the first power supply voltage line 172 may be arranged between the data line 181 and the node connection line 171. Therefore, the first power supply voltage line 172 may reduce coupling between the data line 181 and the first gate electrode G1 and between the node connection line 171 and the data line 181.

The second power supply voltage line 183 may be connected to the first power supply voltage line 172 through a contact hole 62 formed in the first planarization layer 118 (see FIG. 5). As illustrated in FIGS. 3, 4 and 8, the second power supply voltage line 183 may cover the third semiconductor layer AO3 of the third transistor T3 and the fourth semiconductor layer AO4 of the fourth transistor T4. For example, the second power supply voltage line 183 may overlap the third semiconductor layer AO3 of the third transistor T3 and the fourth semiconductor layer AO4 of the fourth transistor T4. Therefore, the second power supply voltage line 183 may serve to block light that may be applied from above the substrate 100. Also, part of the second power supply voltage line 183 may overlap the node connection line 171. When seen in a plan view, another part of the second power supply voltage line 183 may be arranged between the data line 181 and the node connection line 171. Therefore, the second power supply voltage line 183 may reduce coupling between the node connection line 171 and the data line 181.

The connection electrode 185 may be connected to the connection electrode 179 through a contact hole 63 formed in the first planarization layer 118 so as to be connected to the drain region D6 of the sixth transistor T6 (see FIG. 5). The connection electrode 185 may be connected to the pixel electrode 310 through a contact hole 64 formed in the second planarization layer 119 above the first planarization layer 118, and may be configured to transmit, to the pixel electrode 310, a signal applied through the sixth transistor T6.

The first planarization layer 118 and the second planarization layer 119 may each include an organic material, such as, for example, acryl resin, benzocyclobutene (BCB), polyimide (PI), or hexamethyldisiloxane (HMDSO). Alternatively, the first planarization layer 118 and the second planarization layer 119 may each include an inorganic insulating material. For example, the inorganic insulating material may include, for example, silicon oxide ($SiO_x$), silicon nitride ($SiN_x$), and/or silicon oxynitride (SiON). The first planarization layer 118 and the second planarization layer 119 may serve as a protective layer covering the first to seventh transistors T1 to T7 and may be provided so that the upper portions of the first planarization layer 118 and the second planarization layer 119 are planarized. The first planarization layer 118 and the second planarization layer 119 may each be a single layer or a multi-layer.

A pixel defining layer 120 may be arranged on the second planarization layer 119. Because the pixel defining layer 120 includes an opening corresponding to each pixel, that is, an opening exposing at least a central portion of the pixel electrode 310, the pixel defining layer 120 may serve to define a pixel, and may cover an edge of the pixel electrode 310. Also, the pixel defining layer 120 may increase a distance between an edge of the pixel electrode 310 and the opposite electrode 330 above the pixel electrode 310, thus preventing arcs from occurring at the edge of the pixel electrode 310. The pixel defining layer 120 may include, for example, an organic material such as, for example, polyimide (PI) or hexamethyldisiloxane (HMDSO).

An intermediate layer 320 of the OLED may include a low-molecular-weight material or a high-molecular-weight material each emitting light having a predetermined color. When the intermediate layer 320 includes a low-molecular-weight material, the intermediate layer 320 may have a single-layered structure or a multi-layered structure including a hole injection layer (HIL), a hole transport layer (HTL), an emission layer (EML), an electron transport layer (ETL), and an electron injection layer (EIL). In an exemplary embodiment of the present disclosure, the EML may include at least one of materials emitting red, green, or blue light, and may include a fluorescent material or a phosphorescent material. The intermediate layer 320 may include various organic materials, for example, copper phthalocyanine (CuPc), N,N'-di(naphthalene-1-yl)-N,N'-diphenyl-benzidine (NPB), and tris-8-hydroxyquinoline aluminum (Alq3). These layers may be formed by vacuum deposition.

When the intermediate layer 320 includes a high-molecular-weight material, the intermediate layer 320 may have a structure including an HTL and an EML. For example, in addition to an EML, the intermediate layer 320 may include at least one of an HTL, an HIL, an EIL, or an ETL. In this case, the HTL may include poly(3,4-ethylenedioxythiophene) (PEDOT), and the EML may include a poly-phenylenevinylene (PPV)-based polymer or a polyfluorene-based polymer. The intermediate layer 320 may be formed by screen printing, inkjet printing, or laser induced thermal image (LITI).

The intermediate layer 320 is not limited thereto. The intermediate layer 320 may have various structures. The intermediate layer 320 may include an integrated layer throughout the plurality of pixel electrodes 310 or may include layers patterned to correspond to the pixel electrodes 310.

The opposite electrode 330 may be integrally formed with respect to a plurality of OLEDs and may correspond to the pixel electrodes 310. The opposite electrode 330 may include a transparent electrode or a reflective electrode, and may include at least one of, for example, silver (Ag), aluminum (Al), magnesium (Mg), lithium (Li), calcium (Ca), copper (Cu), lithium fluoride/calcium (LiF/Ca), lithium fluoride/aluminum (LiF/Al), magnesium-silver (MgAg), or calcium-silver (CaAg).

The OLEDs may be easily damaged by external moisture or oxygen. Accordingly, a thin-film encapsulating layer or a sealing substrate may be arranged thereon to cover the OLEDs so as to protect the OLEDs. The thin-film encapsulation layer may cover the display area DA and extend to the outside of the display area DA. The thin-film encapsulation layer may include at least one inorganic encapsulation layer including an inorganic material and at least one organic encapsulation layer including an organic material. In an exemplary embodiment of the present disclosure, the thin-film encapsulation layer may have a structure in which a first inorganic encapsulation layer, an organic encapsulation layer, and a second inorganic encapsulation layer are stacked. In an exemplary embodiment of the present disclosure, the second inorganic encapsulation layer may be deposited to directly contact the first inorganic encapsulation layer in an edge area of the display device, the second inorganic encapsulation layer may seal the organic encapsulation layer such that the organic encapsulation layer is not exposed to the outside. Accordingly, external moisture or oxygen may be prevented or reduced from being infiltrated into the display area DA through the organic encapsulation layer. A sealing substrate may be arranged to face the substrate 100 and may be bonded to the substrate 100 in the peripheral area PA by a sealing member such as sealant or frit.

A spacer for preventing mask scratches may be further included on the pixel defining layer 120, and various functional layers such as a polarizing layer, a black matrix, a color filter, for reducing external light reflection, and/or a touch screen layer including a touch electrode may be provided on the thin-film encapsulation layer.

Figure 9:
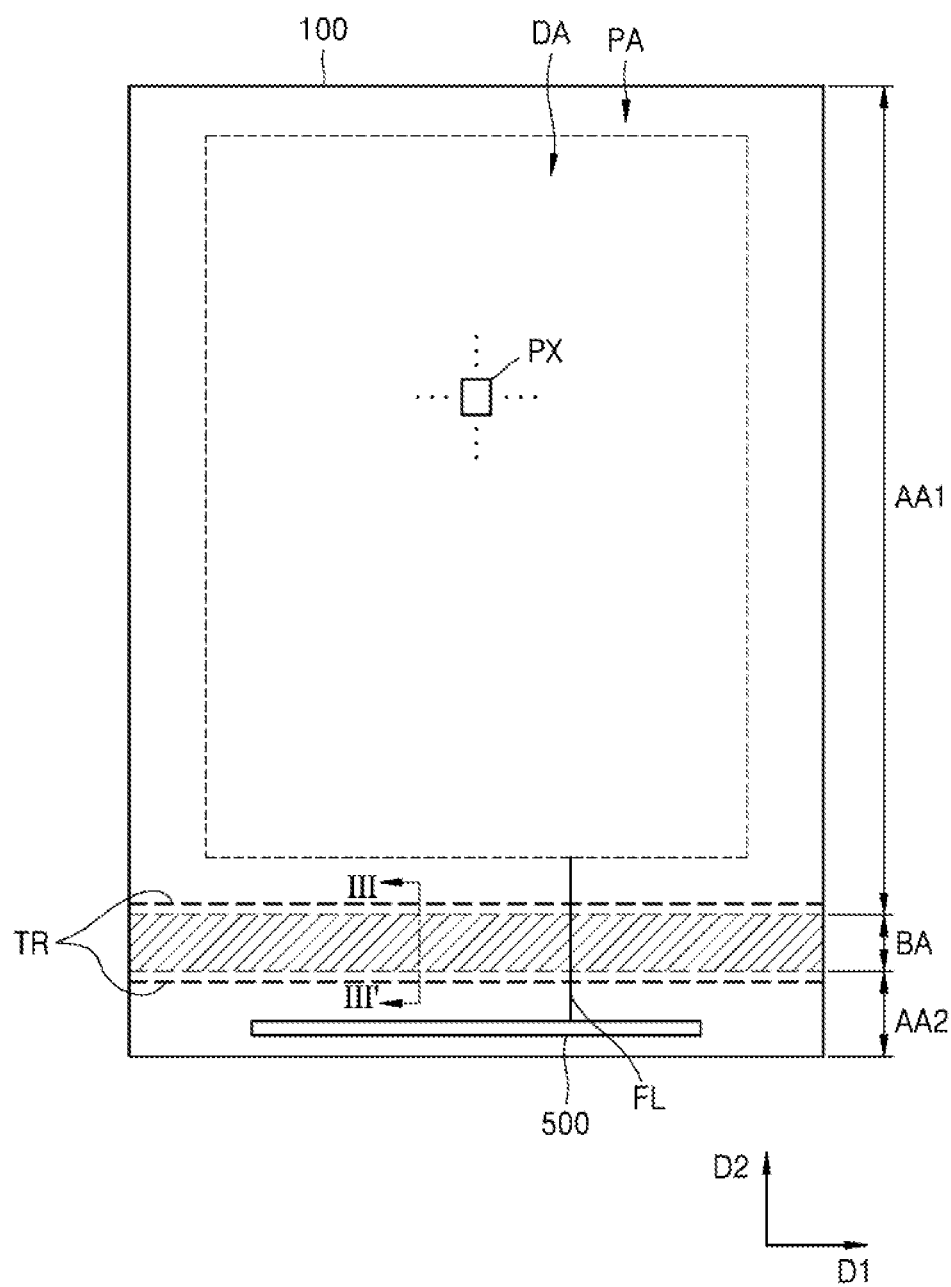
FIG. 9 is a schematic diagram of a display device according to an exemplary embodiment of the present disclosure.
Figure 10A:
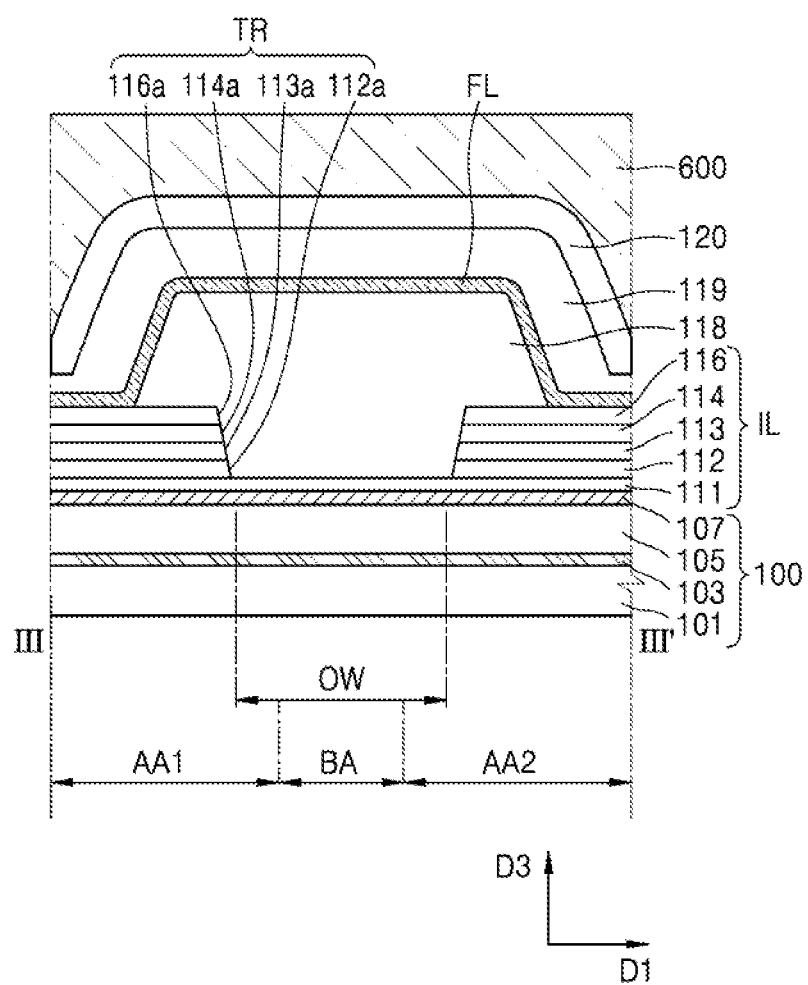
FIGS. 10A to 10C are schematic cross-sectional views of the display device of FIG. 9 taken along line III-III'.
Figure 10B:
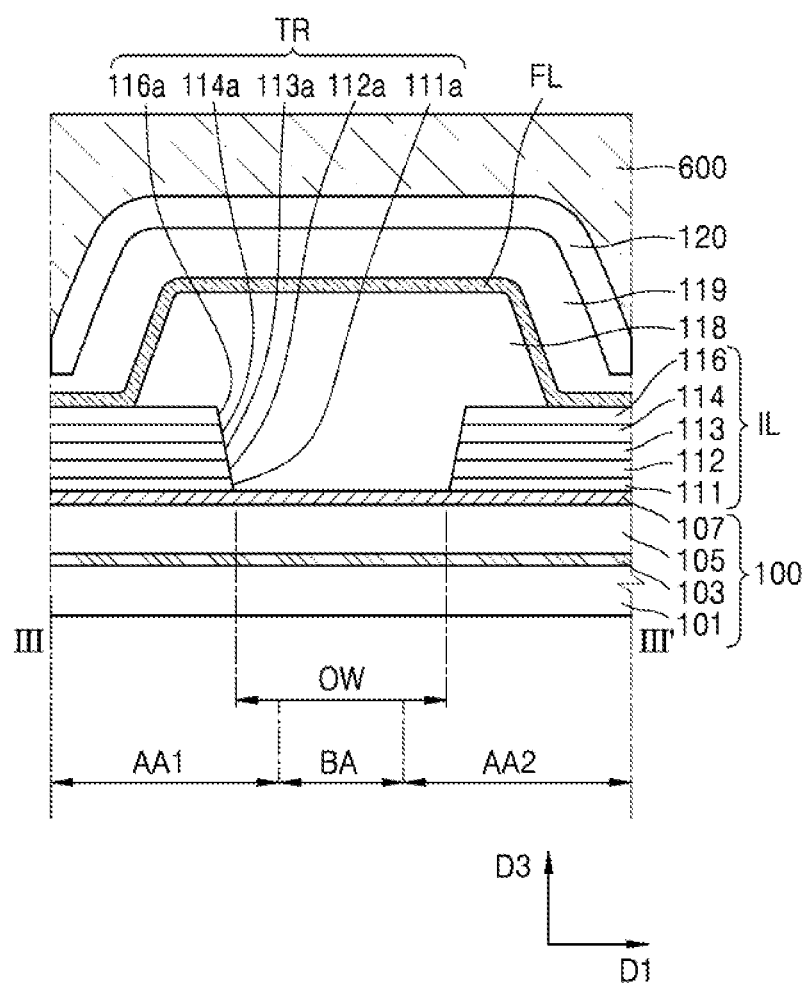
Figure 10C:
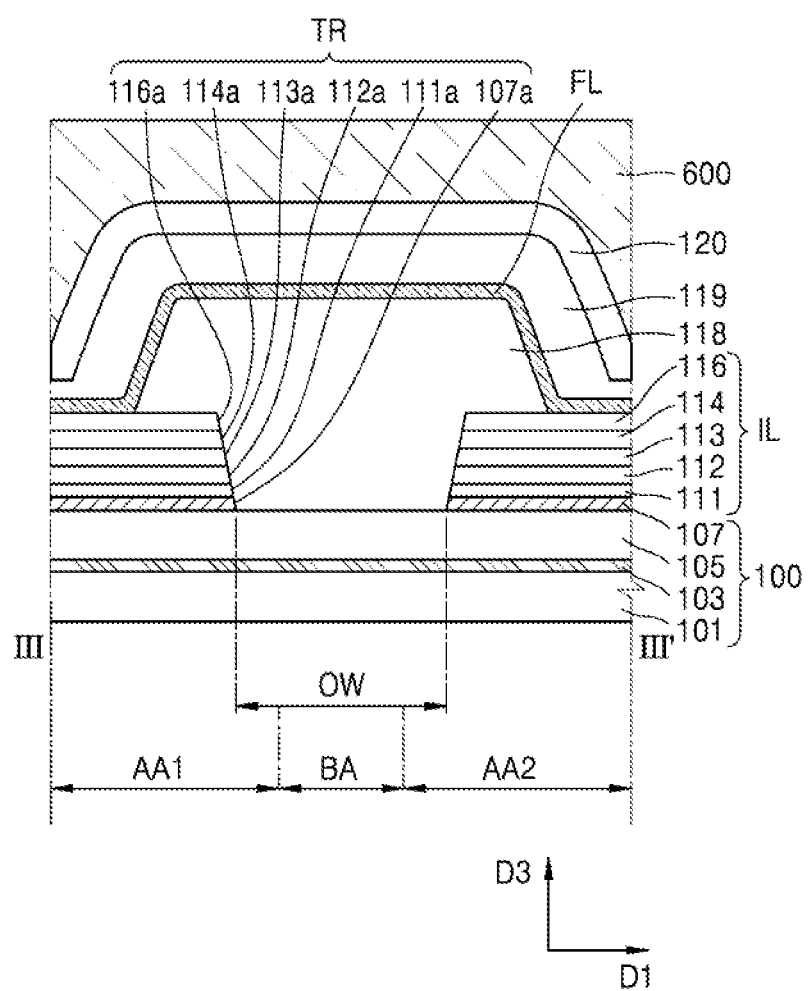
Figure 11:
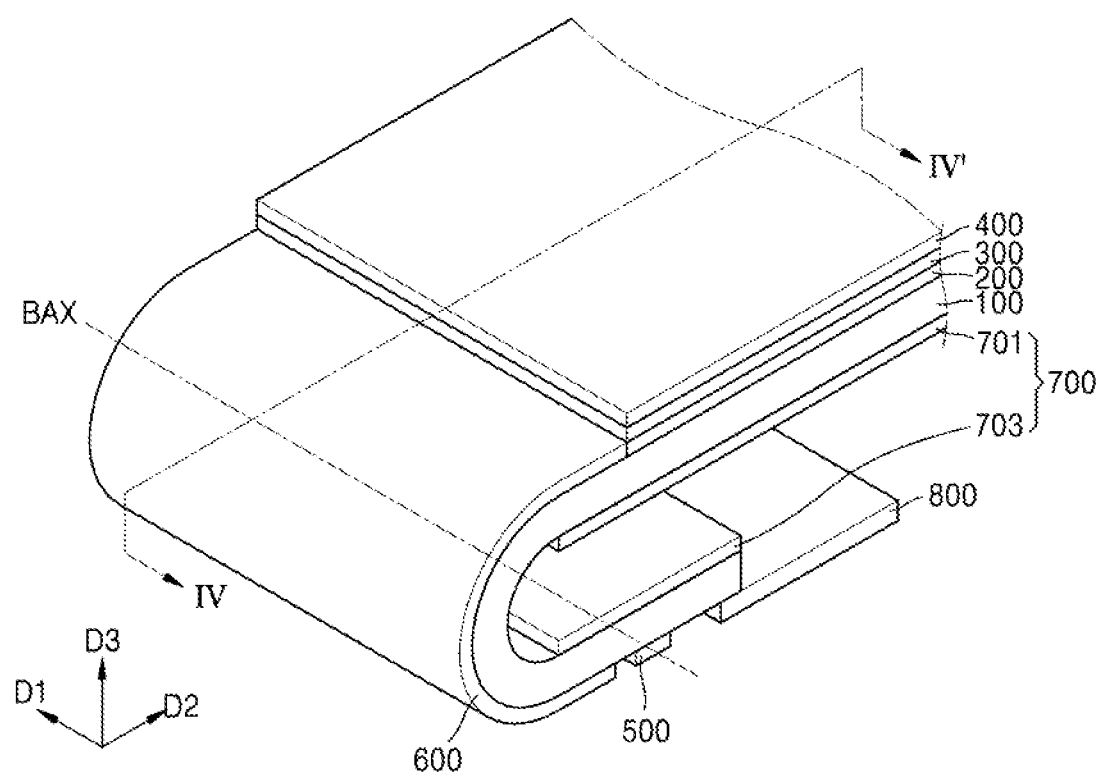
FIG. 11 is a perspective view schematically illustrating part of the display device of FIG. 9 after bending.
Figure 12:
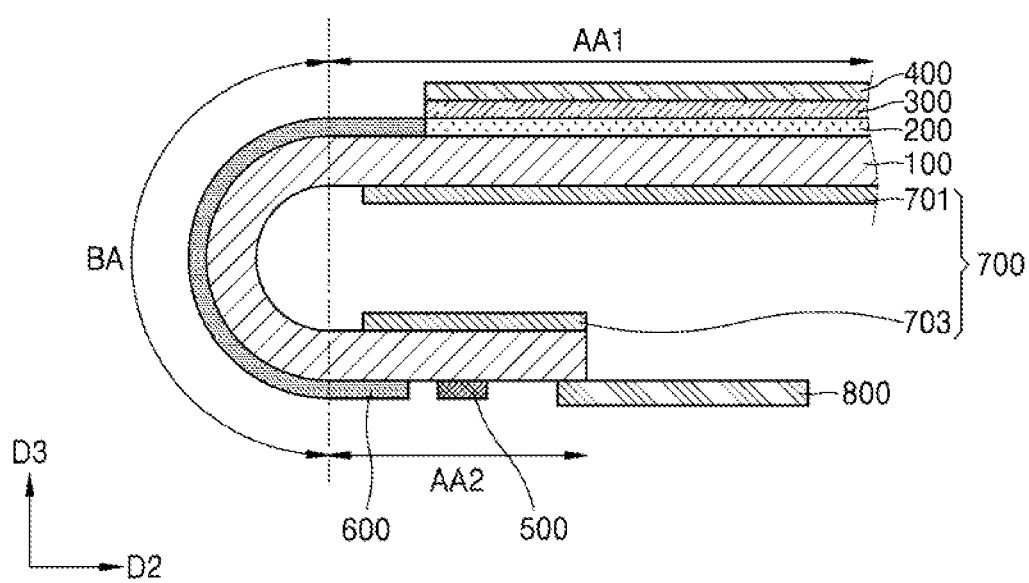
FIG. 12 is a schematic cross-sectional view of the display device of FIG. 11 taken along line IV-IV' of FIG. 11.

FIG. 9 is a schematic diagram of a display device according to an exemplary embodiment of the present disclosure. FIGS. 10A to 10C are schematic cross-sectional views of the display device of FIG. 9 taken along line III-III'. FIG. 11 is a perspective view schematically illustrating part of the display device of FIG. 9 after bending. FIG. 12 is a schematic cross-sectional view of the display device of FIG. 11 taken along line IV-IV' of FIG. 11.

Referring to FIG. 9, a substrate 100 may include a display area DA in which an image is displayed and a peripheral area PA arranged around the display area DA. Also, the substrate 100 may include a first area AA1, a second area AA2, and a bending area BA located between the first area AA1 and the second area AA2. A driver 500 may be arranged in the second area AA2 and/or the peripheral area PA.

The first area AA1 may include the display area DA and the peripheral area PA that is a non-display area surrounding the display area DA. The second area AA2 may also include the peripheral area PA.

The substrate 100 may have the bending area BA extending in a first direction D1. The bending area BA may be included in the peripheral area PA, and may be located between the first area AA1 and the second area AA2 in a second direction D2 intersecting with the first direction D1. As illustrated in FIG. 11, the substrate 100 may be bent about a bending axis BAX extending in the first direction D1. A trench TR of an inorganic insulating layer (IL of FIG. 10A) may be provided in the peripheral area PA along the first direction D1 of the bending area BA. Fan-out lines FL extending from the display area DA and crossing the bending area BA may be further included on the substrate 100.

The substrate 100 may include a first base layer 101, a first barrier layer 103, a second base layer 105, and a second barrier layer 107. The first base layer 101 and the second base layer 105 may each include a polymer resin. The first barrier layer 103 and the second barrier layer 107 may each be a single layer or a multi-layer including an inorganic material.

A buffer layer 111, a first gate insulating layer 112, a second gate insulating layer 113, a first interlayer insulating layer 114, and a second interlayer insulating layer 116, which each includes an inorganic material, may be collectively referred to as an inorganic insulating layer IL. FIG. 10A illustrates that the inorganic insulating layer IL in the peripheral area PA including the bending area BA includes the buffer layer 111, the first gate insulating layer 112, the second gate insulating layer 113, the first interlayer insulating layer 114, and the second interlayer insulating layer 116. However, the present disclosure is not limited thereto. For example, in an exemplary embodiment of the present disclosure, the inorganic insulating layer IL may include at least one selected from the buffer layer 111, the first gate insulating layer 112, the second gate insulating layer 113, the first interlayer insulating layer 114, and the second interlayer insulating layer 116.

The inorganic insulating layer IL may include a trench TR corresponding to the bending area BA. The trench TR penetrating through at least one selected from the buffer layer 111, the first gate insulating layer 112, the second gate insulating layer 113, the first interlayer insulating layer 114, and the second interlayer insulating layer 116 of the inorganic insulating layer IL may be formed in the bending area BA.

In an exemplary embodiment of the present disclosure, as illustrated in FIG. 10A, the trench TR may penetrate through the first gate insulating layer 112, the second gate insulating layer 113, the first interlayer insulating layer 114, and the second interlayer insulating layer 116. In the trench TR, an opening 112a of the first gate insulating layer 112, an opening 113a of the second gate insulating layer 113, an opening 114a of the first interlayer insulating layer 114, and an opening 116a of the second interlayer insulating layer 116, which correspond to the bending area BA, may be included. FIG. 10A illustrates that the inner surfaces of the opening 112a of the first gate insulating layer 112, the opening 113a of the second gate insulating layer 113, the opening 114a of the first interlayer insulating layer 114, and the opening 116a of the second interlayer insulating layer 116 coincide with each other. However, the present disclosure is not limited thereto. For example, in an exemplary embodiment of the present disclosure, the inner surfaces of the openings 112a, 113a, 114a, and 116a may not coincide with each other, and the sizes of the openings 112a, 113a, 114a, and 116a may be different from each other. The trench TR may be filled with first planarization layer 118. The fan-out line FL, the second planarization layer 119, the pixel defining layer 120 and the bending protective layer 600 may sequentially formed on the first planarization layer 118 over the trench TR.

In an exemplary embodiment of the present disclosure, as illustrated in FIG. 10B, a trench TR may include an opening 111a of a buffer layer 111, an opening 112a of a first gate insulating layer 112, an opening 113a of a second gate insulating layer 113, an opening 114a of a first interlayer insulating layer 114, and an opening 116a of a second interlayer insulating layer 116.

In an exemplary embodiment of the present disclosure, as illustrated in FIG. 10O, a trench TR may also include an opening 107a corresponding to a bending area BA in a second barrier layer 107. The opening 107a of the second barrier layer 107 may correspond to the openings 111a, 112a, 113a, 114a, and 116a of the inorganic insulating layer IL.

That the trench TR corresponds to the bending area BA may mean that the trench TR overlaps the bending area BA. In this case, an area of the trench TR may be greater than an area of the bending area BA. FIGS. 10A to 10O illustrate that a width OW of the trench TR is greater than a width of the bending area BA in the first direction D1. The area of the trench TR may be defined as the area of the bottom surface having the minimum area when the trench TR is viewed from above.

As illustrated in FIG. 11, the display device according to an exemplary embodiment of the present disclosure may have a shape in which part of the substrate 100, which is part of the display device, is bent, and therefore, part of the display device is bent like the substrate 100.

Referring to FIGS. 11 and 12, the display device according to the present exemplary embodiment may include: a substrate 100 having a first area AA1, a second area AA2, and a bending area BA between the first area AA1 and the second area AA2; a display member 200, a sensing member 300, and a polarizing member 400, which are arranged in the first area AA1 of the substrate 100; and a driver 500 arranged in the second area AA2 of the substrate 100. A window may be attached to the upper portion of the polarizing member 400. The window may extend not only to the display area DA but also to the peripheral area PA including the bending area BA. Therefore, the window may protect the bending area BA from external impact.

The display member 200 configured to display an image may be arranged in the display area DA of the first area AA1. The display member 200 may include a plurality of pixels PX, and the pixels PX may each include a display element and a pixel circuit including a TFT configured to control light emission of the display element. Thus, the display elements and the TFTs are arranged in the display area DA. The display element may include, for example, an OLED. In an exemplary embodiment of the present disclosure, the pixel circuit that controls the light emission of the OLED may include at least one TFT including silicon semiconductor and at least one TFT including oxide semiconductor, thereby providing a high-resolution display device having low power consumption. The display member 200 may be a display panel including an encapsulation member. The encapsulation member may cover the display elements and the TFTs in the display area DA, and may extend to the outside of the display area DA. In an exemplary embodiment of the present disclosure, the encapsulation member may include an encapsulation substrate and a sealant that bonds the substrate 100 to the encapsulation substrate. In an exemplary embodiment of the present disclosure, the encapsulation member may be an encapsulation layer. The encapsulation layer may include at least one inorganic encapsulation layer and at least one organic encapsulation layer. The encapsulation layer may complement characteristics of the display element, which is vulnerable to oxygen and moisture, by blocking and sealing the OLED from the outside.

The sensing member 300 may be provided on the display member 200. The sensing member 300 may detect external touch information and obtain coordinate information about an input point by using the detected external touch information as an input signal. The sensing member 300 may include a sensing electrode (or a touch electrode) and trace lines connected to the sensing electrode. The sensing member 300 may sense an external input in a mutual capacitance method and/or a self capacitance method. For example, the sensing member 300 may obtain information on the external input through a change in capacitance between two sensing electrodes.

The sensing member 300 may be directly formed and embedded on the display member 200, or may be provided as a separate member and mounted on the display member 200. For example, the sensing member 300 may be continuously formed after the process of forming the display member 200. In this case, the sensing member 300 may be understood as part of the display member 200. An adhesive layer may not be arranged between the sensing member 300 and the display member 200. The sensing member 300 may be bonded to the display member 200 through the adhesive layer. FIG. 11 illustrates that the sensing member 300 is arranged between the display member 200 and the polarizing member 400, but the present disclosure is not limited thereto. For example, in an exemplary embodiment of the present disclosure, the sensing member 300 may be arranged on the polarizing member 400.

The polarizing member 400 may be arranged on the sensing member 300. An adhesive layer may be arranged between the polarizing member 400 and the sensing member 300. Similarly, an adhesive layer may also be arranged between the sensing member 300 and the display member 200. The adhesive layer may be a transparent adhesive layer. For example, the adhesive layer may be an optically clear adhesive (OCA). However, the present disclosure is not limited thereto. For example, an optically clear resin (OCR) may be applied. Also, in an exemplary embodiment of the present disclosure, the adhesive layer may include a pressure sensitive adhesive (PSA). The PSA may include a polymer cured product. The PSA may be formed in the form of a film including an adhesive and may perform an adhesive function in response to a pressure provided from the outside. The PSA may include an acryl-based or rubber-based adhesive, or an adhesive in which fine particles such as zirconia ($ZrO_2$) are included in the adhesive.

The polarizing member 400 may include an anti-reflective layer. The anti-reflective layer may reduce reflectance of light (external light) incident from the outside toward the display member 200 through the window bonded to the upper portion of the polarizing member 400. The anti-reflective layer may include a retarder and a polarizer. The phase retarder may be a film type retarder or a liquid crystal coating type retarder and may include a $\lambda/2$ retarder and/or a $\lambda/4$ retarder. In an exemplary embodiment of the present disclosure, the polarizing member 400 may include two layers of retarder with a first layer of retarder having a $\lambda/2$ retardation value, and a second layer of retarder positioned below the first layer of retarder and having a $\lambda/4$ retardation value. The polarizer may also be a film type polarizer or a liquid crystal coating type polarizer. The film type polarizer may include a stretched synthetic resin film, and the liquid crystal coating type polarizer may include liquid crystals arranged in a certain array. The film type polarizer may be a uniaxially stretched film or a biaxially stretched film. The retarder and the polarizer may each further include a protective film. For example, the polarizer may be interposed between two protective films. The protective films of the retarder and the polarizer may be defined as a base layer of the anti-reflective layer.

In an exemplary embodiment of the present disclosure, the anti-reflective layer may include a black matrix and color filters. The color filters may be arranged considering the colors of light emitted from the pixels of the display member 200. Thus, the desired color may be realized by filtering the light emitted by each of the pixels with the corresponding color filter. The color filters may each include a red, green, or blue pigment or dye. Alternatively, the color filters may each further include, in addition to the pigment or dye, a quantum dot. Alternatively, some of the color filters may not include the pigment or dye and may include scattering particles such as titanium oxide ($TiO_2$) particles.

In an exemplary embodiment of the present disclosure, the anti-reflective layer may include a destructive interference structure. The destructive interference structure may include a first reflective layer and a second reflective layer, which are arranged on different layers. First reflected light and second reflected light, which are respectively reflected from the first reflective layer and the second reflective layer, may destructively interfere with each other, thereby reducing reflectance of external light.

The polarizing member 400 may include a lens layer. The lens layer may enhance light output efficiency of the light emitted from the display member 200 or may reduce color deviation. The lens layer may include a layer having a concave or convex lens shape and/or may include a plurality of layers having different refractive indices. In an exemplary embodiment of the present disclosure, an array of lenses of the lens layer may cover an array of pixels, in which at least one of the lenses may cover at least one of the pixels. The polarizing member 400 may include either or both of the anti-reflective layer and the lens layer.

In an exemplary embodiment of the present disclosure, the polarizing member 400 may be continuously formed after the process of forming the display member 200 and/or the sensing member 300. In this case, an adhesive layer may not be arranged between the polarizing member 400 and the display member 200 and/or the sensing member 300.

The display member 200, the sensing member 300, and the polarizing member 400 may each include an opening in the display area DA. In an exemplary embodiment of the present disclosure, the display member 200, the sensing member 300, and the polarizing member 400 may each include an opening, and these openings may overlap each other. In an exemplary embodiment of the present disclosure, one or more of the display member 200, the sensing member 300, and the polarizing member 400 may not include an opening. The opening may be a hole penetrating through an element or a transmission area without a hole. In an exemplary embodiment of the present disclosure, the openings of the display member 200, the sensing member 300, and the polarizing member 400 may be transmission areas each including a hole. In an exemplary embodiment of the present disclosure, the openings of the display member 200, the sensing member 300, and the polarizing member 400 may be transmission areas each including no hole. A component for adding various functions to the display device may be located in the opening. The component may be located within the opening or may be arranged under the display member 200. For example, the component may be disposed to overlap the opening, and thus, it may easily communicate with the outside through the opening.

The component may include an electronic element. For example, the component may be an electronic element using light or a sound. For example, the electronic element may be a sensor (e.g., infrared sensor) configured to output and/or receive light, a camera configured to receive light and capture an image, a sensor configured to output and sense light or a sound so as to measure a distance or recognize a fingerprint, a small lamp configured to output light, a speaker configured to output a sound, and the like. When the component is an electronic element using light, the component may use light of various wavelength bands, such as visible light, infrared light, and ultraviolet light. In an exemplary embodiment of the present disclosure, the opening may be understood as a transmission area through which the light or/and sound output from the component to the outside or traveling from the outside toward the electronic element may be transmitted. For example, the component may include at least one of a camera, a speaker, a lamp, a light detection sensor, or a thermal detection sensor. The component may detect an external object received through the opening or provide a sound signal such as voice to the outside through the opening.

In an exemplary embodiment of the present disclosure, when the display device is used as a smart watch or a dashboard for a vehicle, the component may be a member such as a clock hand or a needle indicating certain information (e.g., vehicle speed, etc.). When the display device includes a clock hand or a dashboard for a vehicle, the component may be exposed to the outside through the window and the window may include an opening.

The component may include component(s) associated with the functions of the display device as described above or may include a component such as an accessory that increases the aesthetics of the display device.

The driver 500 may be arranged in the second area AA2. The driver 500 may be connected to a pad area of the substrate 100 to supply scan signals and data signals to scan lines and data lines. The pixel circuit of the display member 200 may receive the scan signals and the data signal supplied by the driver 500. The driver 500 may be, for example, a driving IC chip, or may be mounted on the pad area of the substrate 100. In this case, the pad area may be directly electrically connected to the driving IC chip.

In an exemplary embodiment of the present disclosure, a flexible printed circuit board (FPCB) 800 may be mounted on the pad area of the substrate 100, and the driving IC chip may be mounted on the FPCB 800. As the FPCB 800, a chip on film (COF) or a flexible printed circuit (FPC) may be applied. The FPCB 800 may be bent and electrically connected to the display member 200. A driving IC chip that supplies a signal for allowing a plurality of pixels PX of the display member 200 to emit light may be mounted on the FPCB 800.

A bending protective layer 600 may be arranged on the peripheral area PA of the substrate 100. The bending protective layer 600 may be located from the end of the display member 200 to the vicinity of the end of the driver 500 through the bending area BA. However, the present disclosure is not limited thereto. For example, various deformation structures capable of covering the bending area BA may be used.

The bending protective layer 600 may adjust the position of a neutral plane (NP), which is a position at which the strain is substantially zero during bending, so that the strain applied to the substrate 100 is not a tensile strain but a compressive stress. For example, the tensile stress applied to the wiring in the bending area BA may be minimized by allowing the NP to be arranged in the vicinity of the wiring in the bending area BA through the applying of the bending protective layer 600 at the bending area BA. Therefore, the bending protective layer 600 covers the bending area BA of the substrate 100, thereby minimizing damage to the wiring at the bending area BA of the substrate 100.

The bending protective layer 600 may include an acryl-based or silicon-based resin and may also include fine particles in the resin. The fine particles may include polymer-based nanoparticles or microparticles such as silica-containing rubber, epoxy, or epoxy hybrid. In addition, the bending protective layer 600 may also include various films including polyethylene terephthalate (PET).

In FIG. 12, the ends of the display member 200, the sensing member 300, and the polarizing member 400 are equally formed, but the present disclosure is not limited thereto. As described above, the display member 200 may include an OLED, a TFT, and an encapsulation layer covering the OLED and the TFT. In particular, the end of the encapsulation layer may be arranged in a range wider than those of the sensing member 300 and the polarizing member 400. In an exemplary embodiment of the present disclosure, the polarizing member 400 may be arranged to be in contact with the bending protective layer 600 or may be arranged adjacent to the bending protective layer 600. The polarizing member 400 may extend up to the bending area BA to serve as a bending protective layer.

The substrate 100 may have one surface and the other surface located on the opposite side of the one surface, and the display member 200 may be located on the one surface of the substrate 100. A protective film 700 may be located on the other surface of the substrate 100 opposite to the one surface on which the display member 200 is located.

The protective film 700 may be attached to the other surface of the substrate 100, and may serve to protect the display device. The protective film 700 may be attached to the other surface of the substrate 100 through an adhesive layer. The protective film 700 may include a first protective film 701 and a second protective film 703, which are spaced apart from each other. The first protective film 701 may be attached to a position corresponding to the first area AA1 of the substrate 100. The second protective film 703 may be attached to a position corresponding to the second area AA2 of the substrate 100. That is, the protective film 700 may not be attached to a position corresponding to the bending area BA. Therefore, a stress applied to the substrate 100 and the protective film 700 during the bending of the substrate 100 may be minimized to prevent damage to the substrate 100 in the bending area BA during the bending. In the present exemplary embodiment, the protective film 700 has a structure that is not attached to the bending area BA of the substrate 100, but the present disclosure is not limited thereto. For example, the protective film 700 may be located on the other surface of the substrate 100, that is, the front surface, that is, the first area AA1, the second area AA2, and the bending area BA. Alternatively, a groove may be formed in the protective film 700 at the position corresponding to the bending area BA of the substrate 100.

According to an exemplary embodiment of the present disclosure, the driving circuit that drives the display element is configured to include a first TFT including silicon semiconductor and a second TFT including oxide semiconductor, thereby providing a high-resolution display device having low power consumption.

The gate electrode of the first TFT (that is, a driving TFT) and the data line, and the node connection line connected to the first TFT and the data line are spaced apart from each other by the multi-layered insulating layers in the vertical direction, and other voltage layers are provided between the gate electrode of the first TFT and the data line, and the node connection line connected to the first TFT and the data line when seen in a plan view, thereby minimizing the effect due to the coupling capacitance.

Because the boost capacitor is provided, black gradation may be clearly implemented.

According to an exemplary embodiment of the present disclosure, the driving circuit (that is, a pixel circuit) that drives the display element includes the first TFT including silicon semiconductor and the second TFT including oxide semiconductor, thereby providing the high-resolution display device having low power consumption.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments. While specific exemplary embodiments have been described with reference to the figures, it will be understood by those of ordinary skill in the art that various changes in form and details may be made therein without departing from the spirit and scope of the present disclosure as defined by the appended claims.

What is claimed is:

1. A display device comprising:
a substrate comprising a display area in which a display element is arranged;
a first thin-film transistor (TFT) arranged in the display area and comprising a first semiconductor layer including silicon semiconductor and a first gate electrode insulated from the first semiconductor layer;
a first interlayer insulating layer covering the first gate electrode;
a second TFT arranged on the first interlayer insulating layer and comprising a second semiconductor layer including oxide semiconductor and a second gate electrode insulated from the second semiconductor layer;
a second interlayer insulating layer covering the second gate electrode;
a first power supply voltage line arranged on the second interlayer insulating layer;
a first planarization layer covering the first power supply voltage line; and
a data line arranged on the first planarization layer and at least partially overlapping the first power supply voltage line.

2. The display device of claim 1, further comprising a node connection line arranged on the second interlayer insulating layer,
wherein the node connection line has one end electrically connected to the first gate electrode, and an other end electrically connected to the second semiconductor layer.

3. The display device of claim 2, further comprising a second power supply voltage line arranged on the first planarization layer and electrically connected to the first power supply voltage line.

4. The display device of claim 3, wherein the second power supply voltage line overlaps the second semiconductor layer.

5. The display device of claim 3, wherein a portion of the second power supply voltage line is arranged between the data line and the node connection line when seen in a plan view.

6. The display device of claim 1, wherein the second TFT further comprises a third gate electrode arranged below the second semiconductor layer, and
the third gate electrode overlaps the second semiconductor layer.

7. The display device of claim 6, further comprising a first capacitor comprising a lower electrode arranged on a layer the same as that of the first gate electrode and an upper electrode arranged above the lower electrode,
wherein the upper electrode is arranged on a layer the same as that of the third gate electrode.

8. The display device of claim 7, wherein the upper electrode of the first capacitor is electrically connected to the first power supply voltage line.

9. The display device of claim 1, further comprising a second capacitor comprising a lower electrode arranged on a layer the same as that of the first gate electrode and an upper electrode arranged on a layer the same as that of the second semiconductor layer.

10. The display device of claim 9, wherein the upper electrode of the second capacitor comprises oxide semiconductor.

11. The display device of claim 9, wherein the upper electrode of the second capacitor extends from the second semiconductor layer.

12. The display device of claim 1, further comprising a second planarization layer covering the data line, wherein the display element is an organic light-emitting diode (OLED) arranged on the second planarization layer.

13. A display device comprising:
a substrate comprising a display area in which a display element is arranged;
a first thin-film transistor (TFT) arranged in the display area and comprising a first semiconductor layer including silicon semiconductor and a first gate electrode insulated from the first semiconductor layer;
a second TFT arranged in the display area and comprising a second semiconductor layer including oxide semiconductor and a second gate electrode insulated from the second semiconductor layer;
a first power supply voltage line arranged in the display area and extending in a first direction;
a second power supply voltage line extending in the first direction and electrically connected to the first power supply voltage line; and
a data line spaced apart from the second power supply voltage line, extending in the first direction, and at least partially overlapping the first power supply voltage line.

14. The display device of claim 13, wherein the first power supply voltage line is arranged between the data line and the first gate electrode.

15. The display device of claim 13, wherein the second power supply voltage line overlaps the second semiconductor layer.

16. The display device of claim 13, further comprising a node connection line having one end electrically connected to the first gate electrode, and an other end electrically connected to the second semiconductor layer.

17. The display device of claim 16, wherein a portion of the second power supply voltage line is arranged between the data line and the node connection line when seen in a plan view.

18. The display device of claim 13, wherein the second TFT further comprises a third gate electrode arranged below the second semiconductor layer, and
the third gate electrode overlaps the second semiconductor layer.

19. The display device of claim 13, further comprising a capacitor comprising a lower electrode arranged on a layer the same as that of the first gate electrode, and an upper electrode arranged on a layer the same as that of the second semiconductor layer.

20. The display device of claim 19, wherein the upper electrode of the capacitor extends from the second semiconductor layer.

* * * * *